United States Patent
Yang

(10) Patent No.: US 10,896,734 B2
(45) Date of Patent: Jan. 19, 2021

(54) SEMICONDUCTOR MEMORY DEVICE AND METHOD OF OPERATING THE SAME

(71) Applicant: SK hynix Inc., Gyeonggi-do (KR)

(72) Inventor: In Gon Yang, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/049,001

(22) Filed: Jul. 30, 2018

(65) Prior Publication Data

US 2019/0189215 A1 Jun. 20, 2019

(30) Foreign Application Priority Data

Dec. 19, 2017 (KR) .................. 10-2017-0175203

(51) Int. Cl.
| | |
|---|---|
| *G11C 16/10* | (2006.01) |
| *G11C 16/24* | (2006.01) |
| *G11C 16/34* | (2006.01) |
| *G11C 11/56* | (2006.01) |
| *G11C 16/04* | (2006.01) |

(52) U.S. Cl.
CPC .......... *G11C 16/10* (2013.01); *G11C 11/5628* (2013.01); *G11C 16/0483* (2013.01); *G11C 16/24* (2013.01); *G11C 16/3459* (2013.01); *G11C 11/5671* (2013.01); *G11C 2211/5621* (2013.01)

(58) Field of Classification Search
CPC .................................................. G11C 16/10
See application file for complete search history.

(56) References Cited

U.S. PATENT DOCUMENTS

| | | | | |
|---|---|---|---|---|
| 6,469,933 B2* | 10/2002 | Choi | ............. | G11C 16/12 |
| | | | | 365/185.17 |
| 9,224,483 B2* | 12/2015 | Kim | ............. | G11C 16/0483 |
| 2009/0323432 A1* | 12/2009 | Futatsuyama | ...... | G11C 16/3454 |
| | | | | 365/185.22 |
| 2012/0300550 A1* | 11/2012 | Hemink | ............. | G11C 16/3427 |
| | | | | 365/185.17 |
| 2013/0033936 A1* | 2/2013 | Aritome | ............. | G11C 11/5628 |
| | | | | 365/185.19 |
| 2014/0340964 A1* | 11/2014 | Shiino | ................ | G11C 16/26 |
| | | | | 365/185.03 |
| 2016/0314843 A1* | 10/2016 | Tseng | ............. | G11C 16/10 |
| 2017/0294233 A1* | 10/2017 | Helm | ............. | G11C 16/3459 |

FOREIGN PATENT DOCUMENTS

| | | |
|---|---|---|
| KR | 1020100006662 | 1/2010 |
| KR | 1020120126436 | 11/2012 |
| KR | 1020160143511 | 12/2016 |

* cited by examiner

*Primary Examiner* — Douglas King
(74) *Attorney, Agent, or Firm* — IP & T Group LLP

(57) ABSTRACT

Provided herein may be a semiconductor memory device and a method of operating the semiconductor memory device to program a selected physical page of the semiconductor memory device. The method may include performing a plurality of program loops. Each of the program loops may include: applying a bit line voltage based on data input to a page buffer of the semiconductor memory device; applying a two-step program pulse to a word line coupled to the selected physical page; performing a program verify operation on the selected physical page using a double verify scheme; and determining a bit line voltage to be applied in a subsequent program loop based on a result of the program verify operation.

12 Claims, 14 Drawing Sheets

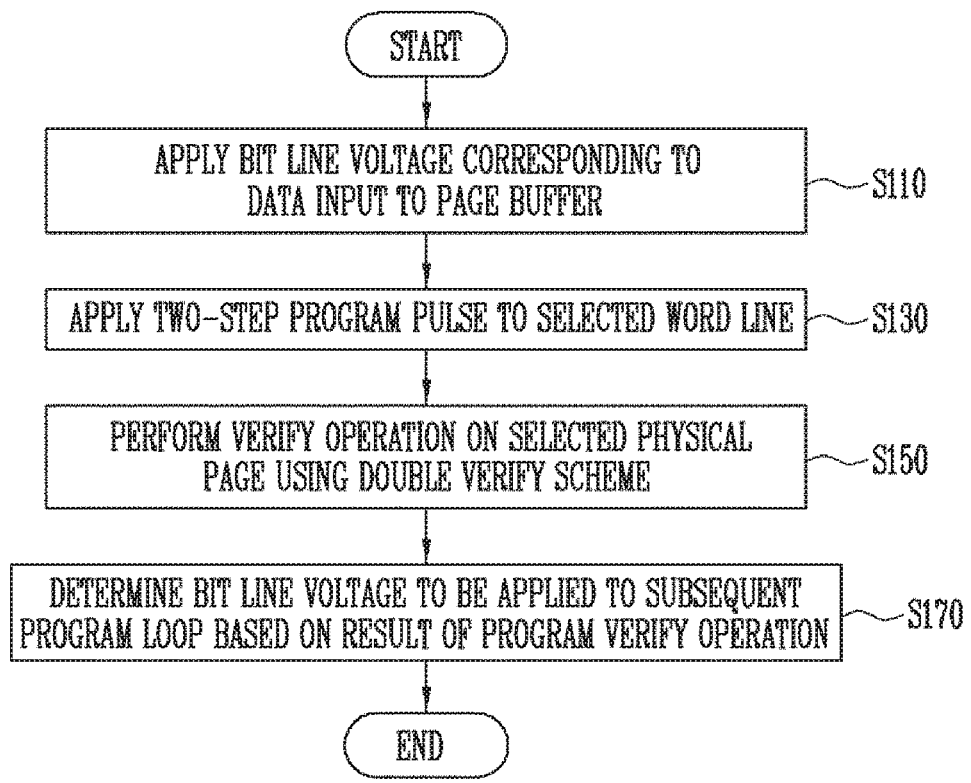
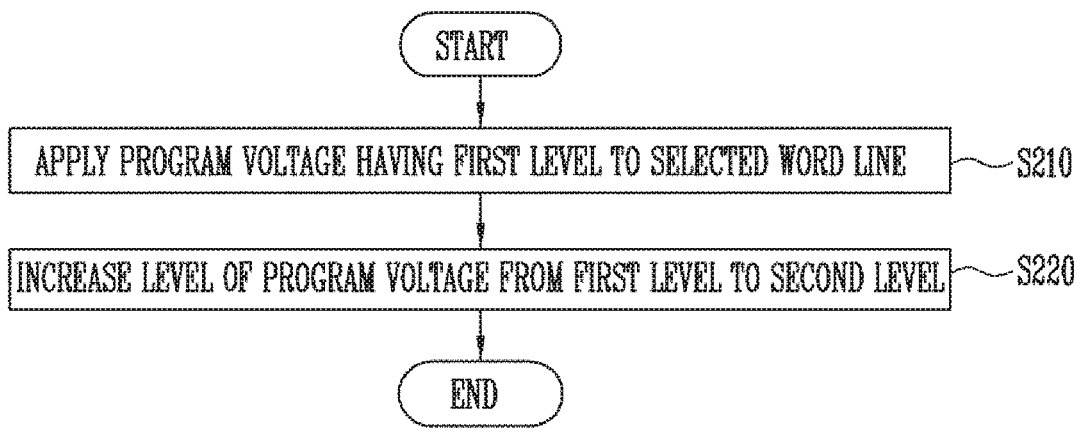

| BIT LINE PRECHARGE | SENSING OPERATION USING Vr1* | BIT LINE PRECHARGE | SENSING OPERATION USING Vr1 |

| BIT LINE PRECHARGE | SENSING OPERATION USING tEV* | SENSING OPERATION USING tEV |

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0175203, filed on Dec. 19, 2017, which is incorporated herein by reference in its entirety.

BACKGROUND

1. Field of Invention

Various embodiments of the present disclosure generally relate to an electronic device. Particularly, the embodiments relate to a semiconductor memory device and a method of operating the semiconductor memory device.

2. Description of Related Art

Generally, a memory device may have a two-dimensional structure in which strings are horizontally arranged on a semiconductor substrate, or a three-dimensional structure in which strings are vertically stacked on a semiconductor substrate. The three-dimensional memory device can overcome a limitation in the degree of integration of the two-dimensional memory device, and may include a plurality of memory cells which are vertically stacked on a semiconductor substrate.

SUMMARY

Various embodiments of the present disclosure are directed to a semiconductor memory device having improved operating speed and reliability.

Various embodiments of the present disclosure are directed to a method of operating a semiconductor memory device having improved operating speed and reliability.

An embodiment of the present disclosure may provide for a method of operating a semiconductor memory device to program a selected physical page of the semiconductor memory device, the method including performing a plurality of program loops. Each of the program loops may include: applying a bit line voltage based on data input to a page buffer of the semiconductor memory device; applying a two-step program pulse to a word line coupled to the selected physical page; performing a program verify operation on the selected physical page using a double verify scheme; and determining a bit line voltage to be applied in a subsequent program loop, based on a result of the program verify operation.

In an embodiment, the applying of the bit line voltage based on the data input to the page buffer may include: applying a program allowable voltage to a bit line coupled to a target memory cell to be programmed; and applying a program inhibit voltage to a bit line coupled to a program inhibit memory cell.

In an embodiment, the applying of the two-step program pulse may include: applying a program voltage having a first voltage level to the word line; and increasing the voltage level of the program voltage from the first level to a second level.

In an embodiment, the performing of the program verify operation on the selected physical page using the double verify scheme may include: performing an auxiliary verify operation by applying an auxiliary verify voltage to the word line, the auxiliary verify voltage corresponding to at least one program state; and performing a main verify operation by applying a main verify voltage to the selected word line, the main verify voltage corresponding to the at least one program state. The auxiliary verify voltage may be less than the main verify voltage.

In an embodiment, the performing of the program verify operation on the selected physical page using the double verify scheme may include: applying a verify voltage to the word line, the verify voltage corresponding to at least one program state, and performing an auxiliary verify operation using an auxiliary evaluation time; and applying the verify voltage to the word line, and performing a main verify operation using a main evaluation time. The auxiliary evaluation time may be shorter than the main evaluation time.

In an embodiment, the determining of the bit line voltage to be applied in the subsequent program loop based on the result of the program verify operation may include: determining whether a threshold voltage of a memory cell in the selected physical page is less than the auxiliary verify voltage; and determining whether the threshold voltage of the memory cell in the selected physical page is less than the main verify voltage.

In an embodiment, when the threshold voltage of the memory cell is less than the auxiliary verify voltage, a first program allowable voltage may be determined to be a voltage to be applied to the bit line coupled to the memory cell in the subsequent program loop.

In an embodiment, when the threshold voltage of the memory cell is equal to or greater than the auxiliary verify voltage and less than the main verify voltage, a second program allowable voltage greater than the first program allowable voltage may be determined to be the voltage to be applied to the bit line coupled to the memory cell in the subsequent program loop.

In an embodiment, when the threshold voltage of the memory cell is greater than the main verify voltage, a program inhibit voltage may be determined to be the voltage to be applied to the bit line coupled to the memory cell in the subsequent program loop.

In an embodiment, the first program allowable voltage may be a ground voltage.

An embodiment of the present disclosure may provide for a method of operating a semiconductor memory device to program a selected physical page of the semiconductor memory device, the method comprising performing a plurality of program loops. Each of the program loops may include: comparing a current program loop count with a threshold loop count; and determining a program pulse to be applied to a word line coupled to the selected physical page based on a result of the comparing.

In an embodiment, the determining of the program pulse to be applied to the word line coupled to the selected physical page based on the result of the comparing may include determining a normal program pulse to be the program pulse to be applied to the word line when the current program loop count is less than the threshold loop count.

In an embodiment, the determining of the program pulse to be applied to the word line coupled to the selected physical page based on the result of the comparing may include determining a two-step program pulse to be the program pulse to be applied to the word line when the current program loop count is equal to or greater than the threshold loop count.

An embodiment of the present disclosure may provide for a semiconductor memory device including: a memory cell array including a plurality of physical pages; a peripheral circuit configured to perform a program operation on a selected physical page among the plurality of physical pages; and a control logic configured to control the program operation of the peripheral circuit. During the program operation of the selected physical page, the control logic may control the peripheral circuit to apply a two-step program pulse to a word line coupled to the selected physical page and perform a program verify operation on the selected physical page using a double verify scheme.

In an embodiment, to apply the two-step program pulse, the control logic may control the peripheral circuit to apply a program voltage having a first level to the word line and increase the program voltage from the first level to a second level.

In an embodiment, to perform the program verify operation on the selected physical page using the double verify scheme, the control logic may control the peripheral circuit to apply an auxiliary verify voltage corresponding to at least one program state to the word line, and apply a main verify voltage corresponding to the program state to the word line.

In an embodiment, when a threshold voltage of a memory cell in the selected physical page is less than the auxiliary verify voltage, the control logic may determine a first program allowable voltage to be a voltage to be applied to a bit line coupled to the memory cell in a subsequent program loop.

In an embodiment, when the threshold voltage of the memory cell is equal to or greater than the auxiliary verify voltage and less than the main verify voltage, the control logic may determine a second program allowable voltage to be the voltage to be applied to the bit line coupled to the memory cell in the subsequent program loop, the second program allowable voltage being greater than the first program allowable voltage.

In an embodiment, when the threshold voltage of the memory cell is greater than the main verify voltage, the control logic may determine a program inhibit voltage to be the voltage to be applied to the bit line coupled to the memory cell in the subsequent program loop.

In an embodiment, the first program allowable voltage may be a ground voltage.

BRIEF DESCRIPTION OF THE DRAWINGS

FIG. 5 is a flowchart describing a method of programming the semiconductor memory device in accordance with an embodiment of the present disclosure.

FIG. 6 is a flowchart describing in detail an example of a program pulse application step of FIG. 5.

DETAILED DESCRIPTION

Figure 1:
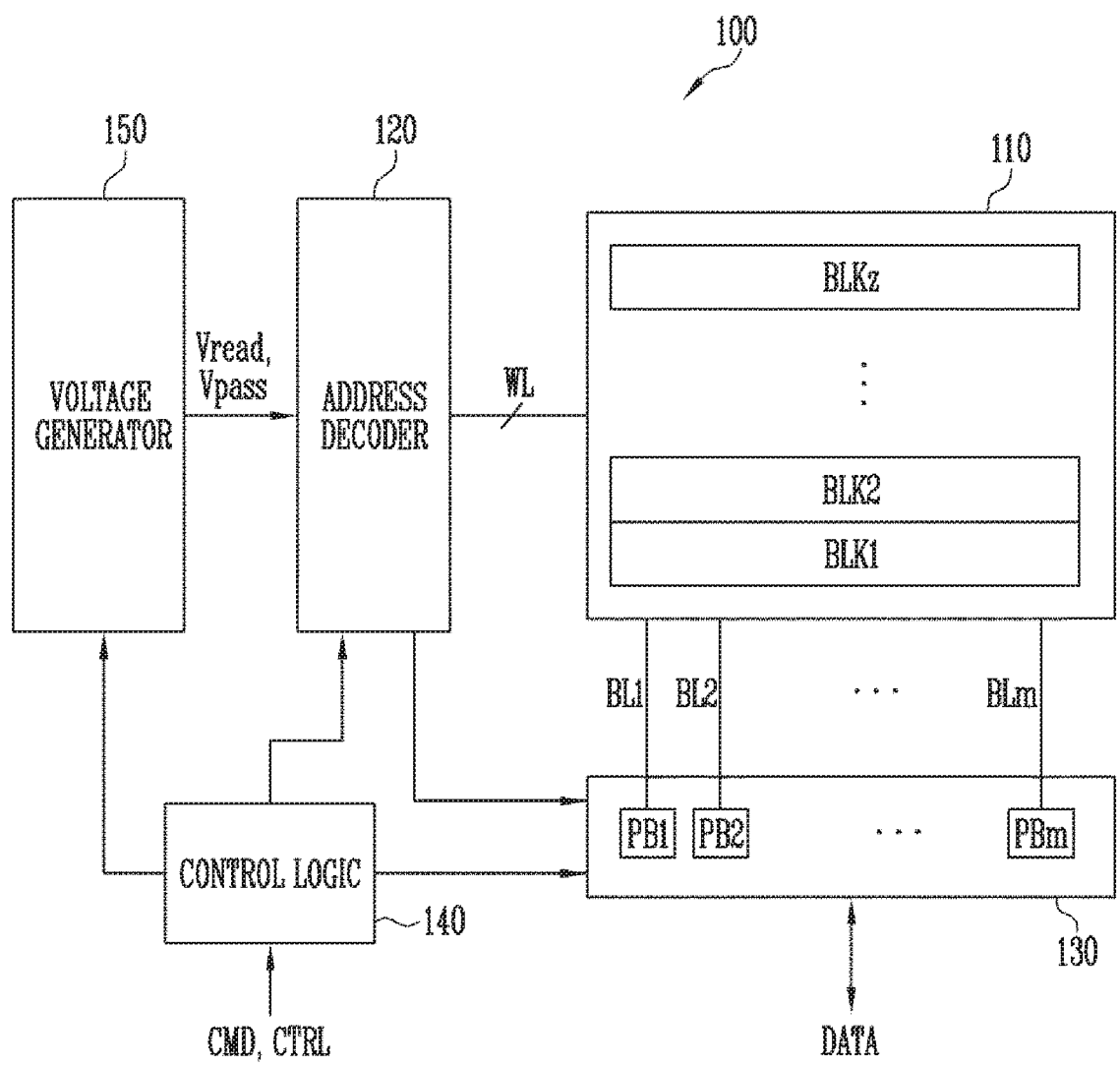
FIG. 1 is a block diagram illustrating a semiconductor memory device in accordance with an embodiment of the present disclosure.

Various embodiments will now be described more fully with reference to the accompanying drawings; however, elements and features of the present disclosure may be configured and/or arranged differently than shown and described herein. Thus, the present invention is not limited to the embodiments set forth herein. Rather, these embodiments are provided so that this disclosure is thorough and complete and fully conveys the scope of the example embodiments to those skilled in the art. It is further noted that reference to "an embodiment" or the like is not necessarily to only one embodiment, and different references to "an embodiment" or the like are not necessarily to the same embodiment(s).

In the drawings, dimensions may be exaggerated for clarity. It will be understood that when an element is referred to as being "between" two elements, it can be the only element between the two elements, or one or more intervening elements may also be present.

Embodiments will be described with reference to the accompanying drawings. Embodiments and structures thereof are described with reference to sectional and schematic illustrations. As such, variations from the shapes of the illustrations as a result, for example, of manufacturing techniques and/or tolerances, are to be expected. Thus, embodiments should not be construed as limited to the particular shapes of elements or their regions illustrated herein; rather, embodiments may include deviations in shapes that result, for example, from manufacturing. In the drawings, lengths and sizes of layers and regions may be exaggerated for clarity. Like reference numerals in the drawings denote like elements.

Terms such as "first" and "second" may be used to identify various components, but they should not limit the various components. Those terms are only used for the purpose of differentiating a component from other components that otherwise have the same or similar name. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form and vice versa, unless the context indicates otherwise. Furthermore, "include/comprise" or "including/comprising" used in the specification represents that one or more stated components, steps, operations, and elements are present, but does not preclude the addition of unstated component(s), step(s), operation(s) and/or elements.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art and unless clearly defined otherwise in this specification, should not be construed as having idealistic or overly formal meanings.

It is also noted that in this specification, "connected/coupled" refers to one component not only directly coupling another component but also indirectly coupling another component through intermediate component(s). On the other hand, "directly connected/directly coupled" refers to one component directly coupling another component without an intermediate component.

FIG. 1 is a block diagram illustrating a semiconductor memory device 100 in accordance with an embodiment of the present disclosure.

Referring to FIG. 1, the semiconductor memory device 100 may include a memory cell array 110, an address decoder 120, a read/write circuit 130, a control logic 140, and a voltage generator 150.

The memory cell array 110 may include a plurality of memory blocks BLK1 to BLKz, which are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the memory cells may be nonvolatile memory cells and be formed of nonvolatile memory cells having a vertical channel structure. The memory cell array 110 may be formed of a memory cell array having a two-dimensional structure. In an embodiment, the memory cell array 110 may be formed of a memory cell array having a three-dimensional structure. Each of the memory cells in the memory cell array 100 may store at least one bit of data. In an embodiment, each of the memory cells may be a single-level cell (SLC), which stores 1-bit data. In an embodiment, each of the memory cells may be a multi-level cell (MLC), which stores 2-bit data. In an embodiment, each of the memory cells may be a triple-level cell, which stores 3-bit data. In an embodiment, each of the memory cells may be a quad-level cell, which stores 4-bit data. In various embodiments, the memory cell array 110 may include a plurality of memory cells each of which stores 5 or more bits of data.

The address decoder 120, the read/write circuit 130, the control logic 140, and the voltage generator 150 may be operated as peripheral circuits for driving the memory cell array 110. The address decoder 120 is coupled to the memory cell array 110 through the word lines WL. The address decoder 120 may operate under control of the control logic 140. The address decoder 120 may receive addresses through an input/output buffer (not shown) provided in the semiconductor memory device 100.

The address decoder 120 may decode a block address among the received addresses. The address decoder 120 selects at least one memory block based on the decoded block address. When a read voltage application operation is performed during a read operation, the address decoder 120 may apply a read voltage (Vread) generated from the voltage generator 150, to a selected word line of a selected memory block, and apply a pass voltage (Vpass) to the other unselected word lines. During a program verify operation, the address decoder 120 may apply a verify voltage generated from the voltage generator 150, to a selected word line of a selected memory block, and apply a pass voltage (Vpass) to the other unselected word lines.

The address decoder 120 may decode a column address among the received addresses. The address decoder 120 may transmit the decoded column address to the read/write circuit 130.

The read or program operation of the semiconductor memory device 100 is performed on a page basis. Addresses received in a request for a read or program operation may include a block address, a row address and a column address. The address decoder 120 may select one memory block and one word line in response to the block address and the row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are coupled to the memory cell array 110 through the bit lines BL1 to BLm. During a read operation or a program verify operation, to sense threshold voltages of the memory cells, the page buffers PB1 to PBm may continuously supply sensing current to the bit lines coupled to the memory cells, and each page buffer may sense, through a sensing node, a change in the amount of flowing current depending on a program state of a corresponding memory cell and latch it as sensing data. The read/write circuit 130 is operated in response to page buffer control signals output from the control logic 140.

During a read operation, the read/write circuit 130 may sense data of the memory cells and temporarily store read-out data, and then output data DATA to the input/output buffer (not shown) of the semiconductor memory device 100. In an embodiment, the read/write circuit 130 may include a column select circuit or the like as well as the page buffers (or page registers).

The control logic 140 is coupled to the address decoder 120, the read/write circuit 130, and the voltage generator 150. The control logic 140 may receive a command CMD and a control signal CTRL through the input/output buffer (not shown) of the semiconductor memory device 100. The control logic 140 may control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a read operation of the memory cell array 110.

The control logic 140 may control the peripheral circuits to apply a two-step program pulse to a selected word line during the program operation. As a result, the amount of shift of a threshold voltage of a slow cell, which is relatively small, may be increased. As a result, the number of program loops required for the program operation may be reduced. Therefore, the overall program speed of the semiconductor memory device may be enhanced.

Furthermore, during the program operation, the control logic 140 may control the peripheral circuits to perform a double verify operation using an auxiliary verify voltage and a main verify voltage at a program verify step and adjust a bit line voltage of a subsequent program loop based on a result of the double verify operation. Hence, threshold voltage increase rates of memory cells which have almost reached a target program state may be reduced, whereby a threshold voltage distribution of each program state may be reduced. As a result, a read margin after the program operation has been completed may be increased, and the operation reliability of the semiconductor memory device may be enhanced. The above-mentioned control operation of the control logic 140 will be described in more detail later with reference to FIGS. 5 to 18.

The voltage generator 150 may generate a read voltage (Vread) and a pass voltage (Vpass) during a read operation in response to a control signal output from the control logic 140. The voltage generator 150 may include, to generate a plurality of voltages having various voltage levels, a plurality of pumping capacitors configured to receive an internal source voltage, and may generate a plurality of voltages by selectively enabling the plurality of pumping capacitors under control of the control logic 140. The voltage generator 150 may generate voltages for a two-step program pulse. The two-step program pulse to be used during the program operation will be described later with reference to FIG. 7. In addition, the voltage generator 150 may generate an auxiliary verify voltage and a main verify voltage for the double verify operation. The auxiliary verify voltage and the main verify voltage will be described later with reference to FIGS. 8 to 13.

Figure 2:
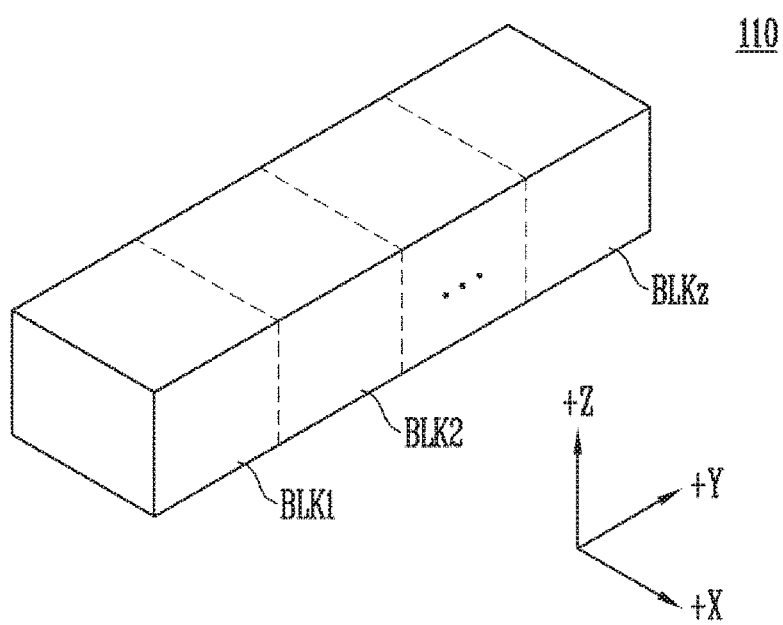
FIG. 2 is a diagram illustrating an example of the memory cell array of FIG. 1.

FIG. 2 is a diagram illustrating an example of the memory cell array 110 of FIG. 1.

Referring to FIG. 2, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 3 and 4.

Figure 3:
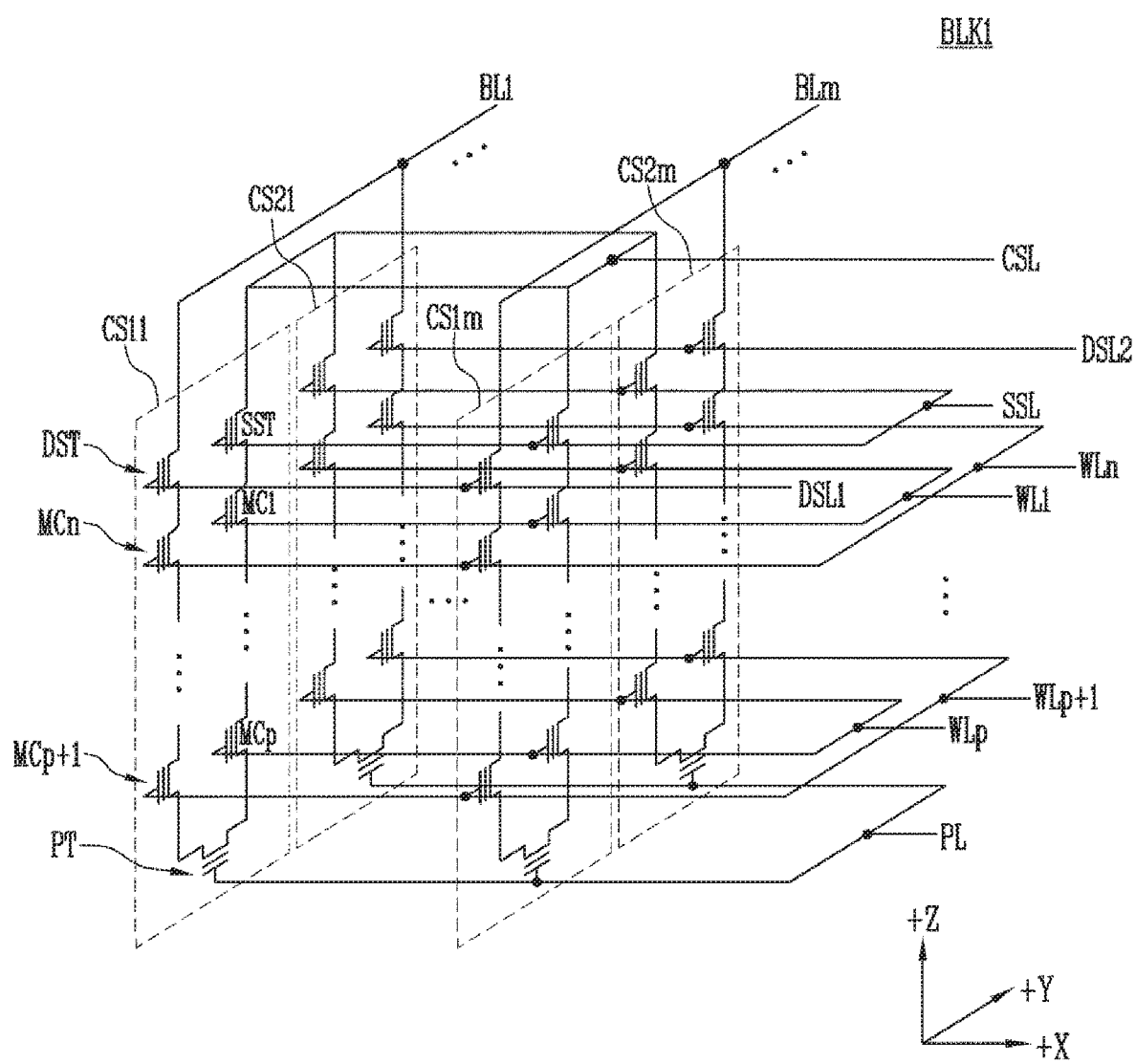
FIG. 3 is a circuit diagram illustrating an example of any one (e.g., BLK1) of memory blocks (e.g., BLK1 to BLKz) of FIG. 2.

FIG. 3 is a circuit diagram illustrating an example of any one (e.g., BLK1) of the memory blocks BLK1 to BLKz of FIG. 2.

Referring to FIG. 3, the first memory block BLK1 may include a plurality of cell strings CS11 to CS1m and CS21 to CS2m. In the first memory block BLK1, m cell strings are arranged in a row direction (i.e., the +X direction). The m cell strings arranged in the row direction are respectively coupled to the first to m-th bit lines BL1 to BLm. (m is a natural number) cell strings are arranged in a column direction (i.e., the +Y direction). In FIG. 3, for clarity and illustrative purposes, only two cell strings arranged in the column direction are illustrated.

Each of the cell strings CS11 to CS1m and CS21 to CS2m is formed in a 'U' shape. Each of the cell strings CS11 to CS1m and CS21 to CS2m includes a pipe transistor PT, memory cells MC1 to MCn, a source select transistor SST, and a drain select transistor DST which are stacked on a substrate (not shown) provided in a lower portion of the memory block BLK1.

The select transistors SST and DST and the memory cells MC1 to MCn may have similar structures. For example, each of the select transistors SST and DST and the memory cells MC1 to MCn may include a channel layer, a tunneling insulating layer, a charge storage layer, and a blocking insulating layer coupled to a corresponding row line.

The source select transistor SST of each cell string is coupled between the common source line CSL and the memory cells MC1 to MCp. Respective gates of the source select transistors SST are coupled in common to a source select line SSL.

The first to n-th memory cells MC1 to MCn in each cell string are coupled between the source select transistor SST and the drain select transistor DST.

The first to n-th memory cells MC1 to MCn are divided into first to path memory cells MC1 to MCp and p+1-th to n-th memory cells MCp+1 to MCn. The first to p-th memory cells MC1 to MCp and the p+1-th to n-th memory cells MCp+1 to MCn are coupled to each other through the pipe transistor PT. The first to p-th memory cells MC1 to MCp are successively arranged in a −Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. Gates of the first to n-th memory cells MC1 to MCn are respectively coupled to first to n-th word lines WL1 to WLn.

A gate of the pipe transistor PT of each cell string is coupled to a pipeline PL.

The drain select transistor DST of each cell string is coupled between the corresponding bit line and the memory cells MCp+1 to MCn. Drain select transistors DST of the cell strings CS11 to CS1m in a first row are coupled to a first drain select line DSL1. Drain select transistors DST of the cell strings CS21 to CS2m in a second row are coupled to a second drain select line DSL2.

In other words, cell strings (e.g., CS11 to CS1m) arranged in the same row (+X direction) are coupled to the same drain select line (e.g., DSL1) through the corresponding drain select transistors. Cell strings (e.g., CS11 and CS21) arranged in different rows are coupled to different drain select lines DSL1 and DSL2.

Cell strings coupled in common to each bit line form a single column. For example, the cell strings CS11 and CS21 that are coupled in common to the first bit line BL1 correspond to a first column. Likewise, cell strings CS1m and CS2m coupled in common to the m-th bit line BLm may correspond to an m-th column. Referring to FIG. 3, the memory block BLK1 includes m columns, and each column includes two cell strings.

Cell strings coupled to each drain select line form a single row. For example, the cell strings CS11 to CS1m coupled to the first drain select line DSL1 correspond to a first row. The cell strings CS21 to CS2m coupled to the second drain select line DSL2 correspond to a second row. As shown in FIG. 3, the memory block BLK1 includes two rows, and each row includes m cell strings.

Figure 4:
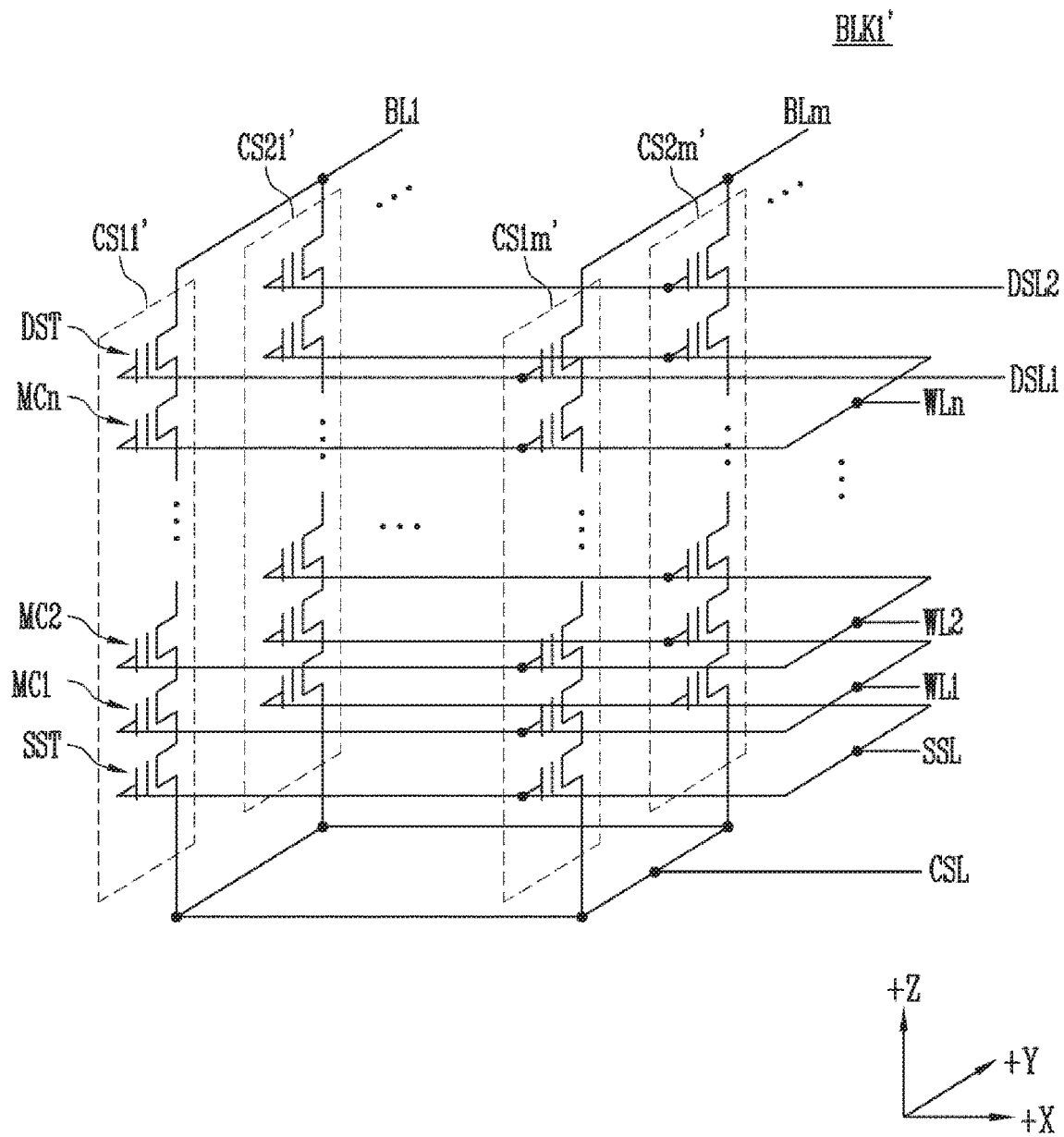
FIG. 4 is a circuit diagram illustrating another example (e.g., BLK1') of any one of the memory blocks (e.g., BLK1 to BLKz) of FIG. 2.

FIG. 4 is a circuit diagram illustrating another example BLK1' of any one of the memory blocks BLK1 to BLKz of FIG. 2.

Referring to FIG. 4, a first memory block BLK1' may include a plurality of cell strings CS11' to CS1$m$' and CS21' to CS2$m$'. In the first memory block BLK1', m cell strings are arranged in a row direction (i.e., the +X direction). The m cell strings arranged in the row direction are respectively coupled to the first to m-th bit lines BL1 to BLm. (m is a natural number) cell strings are arranged in a column direction (i.e., the +Y direction). In FIG. 4, for clarity and illustrative purposes, only two cell strings arranged in the column direction are illustrated.

Each of the cell strings CS11' to CS1$m$' and CS21' to CS2$m$' extends in the +Z direction. Each of the cell strings CS11' to CS1$m$' and CS21' to CS2$m$' may include a source select transistor SST, first to n-th memory cells MC1 to MCn, and a drain select transistor DST which are stacked on a substrate (not shown) provided in a lower portion of the memory block BLK1'.

The respective source select transistors SST of the cell strings are coupled in common to the common source line CSL. The source select transistor SST of each cell string is coupled between the common source line CSL and the memory cells MC1 to MCn. A gate of the source select transistor SST of each cell string is coupled to a source select line SSL.

The first to n-th memory cells MC1 to MCn in each cell string are coupled in series between the source select transistor SST and the drain select transistor DST. Memory cells disposed at the same height are coupled to the same word line. The first to n-th memory cells MC1 to MCn are respectively coupled to first to n-th word lines WL1 to WLn.

The drain select transistor DST of each cell string is coupled between the corresponding bit line and the memory cells MC1 to MCn. The drain select transistors of the cell strings arranged in the same row direction (+X direction) are coupled to the same drain select line. Drain select transistors DST of the cell strings CS11' to CS1$m$' in a first row are coupled to a first drain select line DSL1. Drain select transistors DST of the cell strings CS21 to CS2$m$ in a second row are coupled to a second drain select line DSL2.

Cell strings coupled in common to each bit line form a single column. For example, the cell strings CS11' and CS21' that are coupled in common to the first bit line BL1 correspond to a first column. Likewise, cell strings CS1$m$' and CS2$m$' coupled in common to the m-th bit line BLm may correspond to an m-th column. Referring to FIG. 4, the memory block BLK1' includes m columns, and each column includes two cell strings.

Strings coupled to each drain select line form a single row. For example, the cell strings CS11' to CS1$m$' coupled to the first drain select line DSL1 correspond to a first row. The cell strings CS21' to CS2$m$' coupled to the second drain select line DSL2 correspond to a second row. As shown in FIG. 4, the memory block BLK1' may include two rows, and each row may include m cell strings.

Consequentially, the memory block BLK1' of FIG. 4 has a configuration similar to that of the memory block BLK1 of FIG. 3. In the embodiment shown in FIG. 4, a pipe select transistor PT is excluded from each cell string In FIG. 4, the first to m-th cell strings CS11' to CS1$m$' or CS21' to CS2$m$' arranged in the row direction are respectively coupled to the first to m-th bit lines BL1 to BLm. In an embodiment, even bit lines and odd bit lines may be provided in lieu of the first to m-th bit lines BL1 to BLm. It will be understood that even number-th cell strings among the cell strings CS11' to CS1$m$' or CS21' to CS2$m$' arranged in the row direction are coupled to the respective even bit lines, and odd number-th cell strings among the cell strings CS11' to CS1$m$' or CS21' to CS2$m$' arranged in the row direction are coupled to the respective odd bit lines.

FIG. 5 is a flowchart describing a method of programming the semiconductor memory device in accordance with an embodiment of the present disclosure. Particularly, FIG. 5 is a flowchart describing a single program loop of a plurality of program loops to be performed according to an incremental step pulse programming (ISPP) scheme.

Referring to FIG. 5, the method of programming the semiconductor memory device in accordance with an embodiment of the present disclosure includes the step S110 of applying a bit line voltage corresponding to data input to each page buffer, the step S130 of applying a two-step program pulse to a select word line, the step S150 of performing a program verify operation on a selected physical page using a double verify scheme, and the step S170 of determining a bit line voltage to be applied to a subsequent program loop based on a result of the program verify operation.

At step S110, a bit line voltage corresponding to data input to each page buffer is applied to the corresponding bit line. In order to shift the threshold voltage of a memory cell in response to a program pulse applied to the corresponding word line, a program allowable voltage may be applied to the corresponding bit line. In order to prevent the threshold voltage of a memory cell from being shifted despite a program pulse applied to the corresponding word line, a program inhibit voltage may be applied to the corresponding bit line.

In this specification, a physical page may be defined as a group of memory cells which are coupled to a single word line in the memory block and act as the unit of a program operation or a read operation. Each physical page includes a plurality of memory cells. When each of the memory cells in the physical page is a single-level cell (SLC), the single physical page may correspond to a single logical page. When each of the memory cells in the physical page is a multi-level cell (MLC), which may store 2-bit data, the single physical page may correspond to two logical pages. When each of the memory cells in the physical page is a triple-level cell (TLC), which may store 3-bit data, the single physical page may correspond to three logical pages.

Among memory cells of a selected physical page, the threshold voltage of a memory cell to be maintained in an erase state is not to be shifted. In this case, a program inhibit voltage is applied to a bit line coupled to the memory cell to be maintained in the erase state. For instance, the program inhibit voltage may be a power source voltage. Therefore, due to an increase in voltage by self-boosting of a channel region, a voltage difference between the gate of the corresponding memory cell and a channel is maintained at a set value or less, so that even when a program pulse is applied to the word line, the threshold voltage of the memory cell is not changed.

Among the memory cells of the selected physical page, the threshold voltage of a memory cell to be programmed to a target program state is to be shifted. In this case, a program allowable voltage is applied to a bit line coupled to the memory cell to be programmed. For example, the program allowable voltage may be the ground voltage (0V). Therefore, the potential of the channel region is maintained at a low level, and the threshold voltage of the corresponding memory cell may shift due to a high voltage of a program pulse applied to the word line. As described above, the program allowable voltage may be the ground voltage. Also, a voltage higher than the ground voltage may be used as the program allowable voltage. In this case, because a potential difference between the channel and the gate is comparatively reduced, a shift amount of the threshold voltage may be reduced.

According to the program operation of the semiconductor memory device in accordance with an embodiment of the present disclosure, the bit line voltage to be applied at step S110 is determined at step S170 of a preceding program loop. At step S170, a bit line voltage to be applied to a subsequent program loop is determined. Therefore, a shift amount of threshold voltage of a corresponding memory cell in a subsequent program loop may be adjusted. Thus, a distribution width of a threshold voltage corresponding to each program state may be reduced. This makes it possible to secure a sufficient read margin. As a result, the operating performance of the semiconductor memory device may be enhanced.

At step S130, a two-step program pulse is applied to the selected word line. Because the bit line voltages of the physical page to be programmed have been applied at step S110, the threshold voltages of the memory cells may be selectively shifted by performing the operation of step S130. For example, the threshold voltage of the memory cell coupled to the bit line that has been supplied with the program inhibit voltage is not shifted. The threshold voltage of the memory cell coupled to the bit line that has been supplied with the program allowable voltage is shifted. In this case, the shift amount of the threshold voltage of the memory cell that has been supplied with a comparatively low bit line voltage is relatively large. On the other hand, the shift amount of the threshold voltage of the memory cell that has been supplied with a comparatively high bit line voltage is relatively small.

At step S150, the program verify operation is performed on the selected physical page by the double verify scheme. Bit line voltages of memory cells to be programmed may be selectively determined using the double verify scheme. Thereby, the shift amount of the threshold voltage of each memory cell may be optimized so that the final threshold voltage distribution width thereof may be reduced. The program verify operation using the double verify scheme will be described later herein with reference to FIGS. 8 to 16.

At step S170, a bit line voltage to be applied at a subsequent program loop is determined based on the result of the program verify operation of step S150. The bit line voltage of the memory cells that are maintained in the erase state is the program inhibit voltage and is not changed. Furthermore, the bit line voltage of the memory cells that have already reached the target program state as the result of the program verify operation is also determined to be the program inhibit voltage.

The program allowable voltage is applied to the bit line coupled to the memory cells that have not reached the target program state. The bit line voltage of the memory cell that has almost reached the target program state may be determined to be relatively higher than the existing program allowable voltage. In this case, as described above, because a potential difference between the channel and the gate is comparatively reduced, a shift amount of the threshold voltage may be reduced. Therefore, the threshold voltage of the corresponding memory cell may be prevented from being excessively shifted in a subsequent program loop, whereby the threshold voltage distribution thereof may be narrowed or not become wider. On the other hand, in the case of a memory cell in which there is a large threshold voltage difference between its threshold voltage and the target program state, the existing program allowable voltage (e.g., the ground voltage) is maintained. In this case, the shift amount of the threshold voltage is maintained at a relatively large value.

In the semiconductor memory device in accordance with the embodiment of the present disclosure, because the two-step program pulse is applied at step S130, a shift amount of the threshold voltage of a memory cell having a threshold voltage which is very far from the target program state is comparatively increased. Hence, the total number of times the program loops are performed may be reduced. Consequently, the program speed of the semiconductor memory device may be improved.

Furthermore, as described above, because a shift amount of the threshold voltage of a memory cell having a threshold voltage which is very far from the target program state is comparatively increased by application of the two-step program pulse, the threshold voltage distribution with respect to each program state after the program operation has been completed may be narrowed. Consequently, the amount of secured read margin may be further increased, whereby the operation reliability of the semiconductor memory device may be enhanced.

According to the semiconductor memory device in accordance with an embodiment of the present disclosure, the program verify operation is performed on the selected physical page by the double verify scheme, at step S150, and a bit line voltage to be applied to the subsequent program loop is determined based on the result of the program verify operation, at step S170. Consequently, the shift amount of the threshold voltage of a memory cell that has reached a level near the target program state may be adjusted. As a result, the threshold voltage distribution with respect to each program state after the program operation has been completed may be narrowed, whereby the operation reliability of the semiconductor memory device may be enhanced.

FIG. 6 is a flowchart describing in detail the program pulse application step S130 of FIG. 5. Referring to FIG. 6, the step S130 of applying the two-step program pulse to the selected word line may include the step S210 of applying a program voltage having a first level to the select word line, and the step S220 of increasing the level of the program voltage from the first level to a second level. The program pulse application step shown in FIG. 6 will be described in more detail with reference also to FIG. 7.

Figure 7:
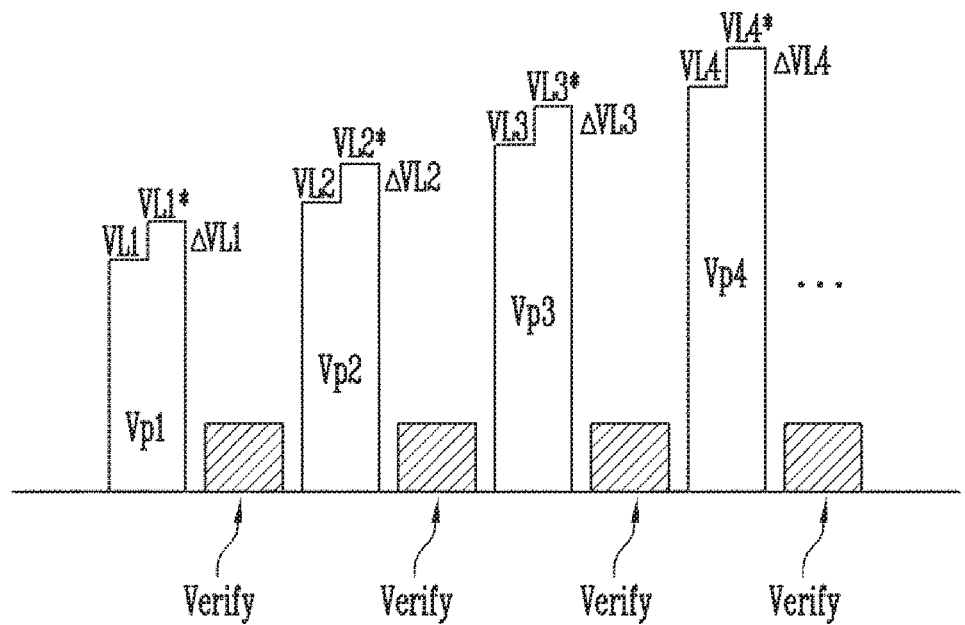
FIG. 7 is a diagram illustrating a method of programming the semiconductor memory device in accordance with an embodiment of the present disclosure.

FIG. 7 is a diagram illustrating a method of programming the semiconductor memory device in accordance with an embodiment of the present disclosure.

Referring to FIG. 7, a method of programming a selected physical page of the semiconductor memory device according to the ISPP scheme is illustrated. Each program loop may include a program pulse application operation and a program verify operation. For the sake of clarity and illustrative purposes, detailed configuration of the verify operation period is omitted in FIG. 7. Each verify operation period of FIG. 7 will be described in detail with reference to FIG. 9. In embodiments of the present disclosure, the program verify operation to be performed in each program loop may be performed by a double verify scheme. The double verify operation will be described in detail later with reference to FIGS. 8 to 16.

As shown in FIG. 7, a program pulse $V_{p1}$, $V_{p2}$, $V_{p3}$, $V_{p4}$, ... to be applied in each program loop has a two-step voltage level. For example, a first program pulse $V_{p1}$ has a voltage of a first level VL1 and a voltage of a second level VL1*. Referring to FIGS. 6 and 7 together, the step S130 of applying the first program pulse Vp1 may be performed by the step S210 of applying the program voltage having the first level VL1 to the selected word line, and the step S220 of increasing the level of the program voltage to the second level VL1*. A difference ΔVL1 between the first level VL1 and the second level VL1* of the first program pulse Vp1 may be changed, as needed based on system or design considerations. Likewise, a differences ΔVL2, ΔVL3, ΔVL4 between the first level VL2, VL3, VL4 and the second level VL2*, VL3*, VL4* of each of the second to fourth program pulses, etc. Vp2, Vp3, Vp4, . . . may also be changed, as needed based on system or design considerations. In an embodiment, the first level VL2, VL3, VL4 of each of the program pulses Vp2, Vp3, and Vp4 may have a value greater than that of the second level VL1*, VL2*, VL3* of the preceding program loop. For example, the first level VL2 of the second program pulse Vp2 may have a value greater than that of the second level VL1* of the first program pulse Vp1. Furthermore, the first level VL3 of the third program pulse Vp3 may have a value greater than that of the second level VL2* of the second program pulse Vp2.

As shown in FIG. 7, since a two-step program pulse rather than a program pulse having a single voltage level is applied, an amount of shift of the threshold voltage of a memory cell, which threshold voltage is relatively far from the target program state, may be increased. Therefore, the total number of program loops may be reduced, whereby the program speed of the semiconductor memory device may be enhanced.

The effect of applying the two-step program pulse will be described in more detail below. Due to characteristics of a process of producing the semiconductor memory device, threshold voltage shift characteristics of each memory cell i in the memory cell array 110 may vary by cells. In detail, with regard to memory cells in the same physical page, under the same conditions, there is a fast cell having a relatively large threshold voltage shift amount and a slow cell having a relatively small threshold voltage shift amount. Therefore, although memory cells are to be programmed to the same program state, the number of program loops needed for the fast cell to reach the target program state is less than the number of program loops needed for the slow cell to reach the target program state.

When the two-step program pulse is applied, the shift amount of the threshold voltage of the slow cell may be increased by the second level VL1*, VL2*, VL3*, VL4* of each program pulse. Consequently, the number of program loops required to complete the program operation may be reduced. As a result, the program speed of the semiconductor memory device may be enhanced.

Figure 8:
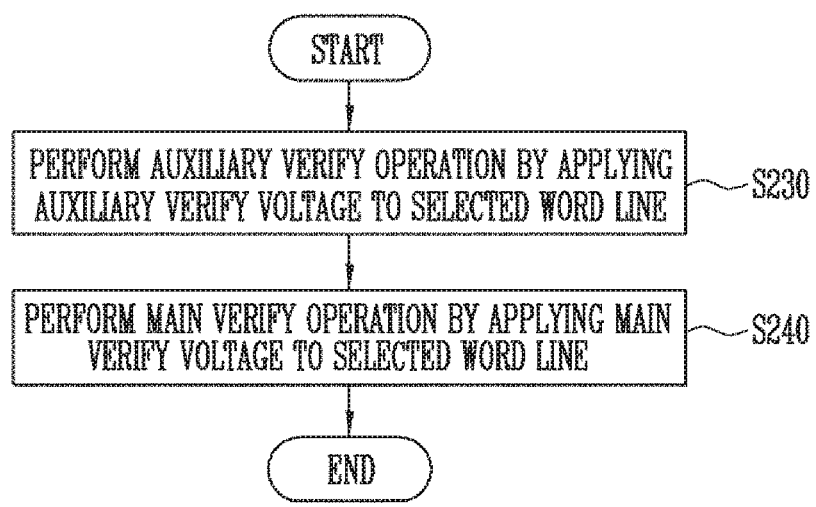
FIG. 8 is a flowchart describing in detail an example of a program verify step of FIG. 5.

FIG. 8 is a flowchart describing in detail an example of the program verify step S150 of FIG. 5. Referring to FIG. 8, the step S150 of performing, as shown in FIG. 5, the program verify operation on the selected physical page by the double verify scheme may include the step S230 of performing an auxiliary verify operation by applying an auxiliary verify voltage to the selected word line, and the step S240 of performing a main verify operation by applying a main verify voltage to the selected word line. Although, in FIG. 8, the step S230 of performing the auxiliary verify operation has been illustrated as preceding the step S240 of performing the main verify operation, aspects of the present invention are not limited to that sequence. For instance, the main verify operation may be performed before the auxiliary verify operation is performed.

The auxiliary verify operation and the main verify operation will be described with reference also to FIG. 9.

Figure 9:
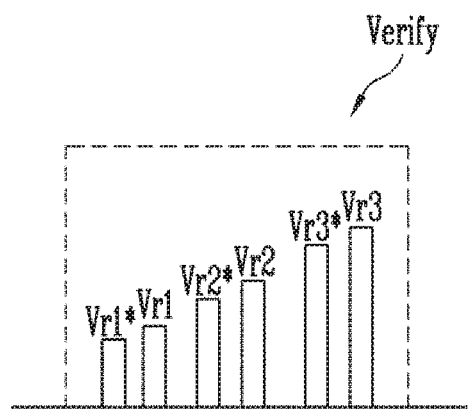
FIG. 9 is a diagram illustrating an example of an auxiliary verify operation and a main verify operation of FIG. 8.

FIG. 9 is a diagram illustrating the auxiliary verify operation and the main verify operation of FIG. 8. FIG. 9 illustrates a verify operation which is performed during a single program loop. The operation of each of the verify periods indicated by hatched regions of FIG. 7 may be the verify operation shown in FIG. 9. FIG. 9 illustrates a verify operation for a multi-level cell (MLC) having one erase state and three program states. A memory cell in the semiconductor memory device in accordance with embodiments of the present disclosure is not limited to the MLC configuration; the target memory cell may also be a single-level cell (SLC), a triple-level cell, or a memory cell having a larger number of states.

Referring to FIG. 9, a first auxiliary verify voltage Vr1* and a first main verify voltage Vr1 for verification of a first program state are applied, a second auxiliary verify voltage Vr2* and a second main verify voltage Vr2 for verification of a second program state are applied, and a third auxiliary verify voltage Vr3* and a third main verify voltage Vr3 for verification of a third program state are applied. However, this is only exemplary; verify voltages for some of the first to third program states may be applied.

For example, at an initial stage of the program operation, there may be no memory cell having a threshold voltage which has been shifted to the second program state or the third program state. In this case, the verify operation for the second program state or the third program state may not be needed. Therefore, the verify operation may be performed by applying only the first auxiliary verify voltage Vr1* and the first main verify voltage Vr1. After the program operation has been performed for some time, there may be a memory cell with a threshold voltage which has been shifted to the second program state, while there may be no memory cell with a threshold voltage which has been shifted to the third program state. In this case, the first auxiliary verify voltage Vr1*, the first main verify voltage Vr1, the second auxiliary verify voltage Vr2*, and the second main verify voltage Vr2 may be applied, but neither the third auxiliary verify voltage Vr3* nor the third main verify voltage Vr3 may be applied.

After all of the memory cells corresponding to the first program state have been completely programmed, there is no need to perform the verify operation for the first program state. In this case, the second auxiliary verify voltage Vr2*, the second main verify voltage Vr2, the third auxiliary verify voltage Vr3*, and the third main verify voltage Vr3 may be applied, but neither the first auxiliary verify voltage Vr1* nor the first main verify voltage Vr1 may be applied. The program operation is continuously performed, and, after all of the memory cells corresponding to the first and second program states have been completely programmed, there is no need to perform the verify operation for the first or second program state. Therefore, the verify operation may be performed by applying only the third auxiliary verify voltage Vr3* and the third main verify voltage Vr3.

In the method of operating the semiconductor memory device in accordance with embodiments of the present disclosure, a double verify operation may be performed at the program verify step to further narrow the distribution width of the threshold voltage. The program method including the double verify operation may also be referred to as "double program". The double verify operation is performed to narrow the threshold voltage distribution width by reducing threshold voltage increase rates of cells which have been close to the target level. In other words, the double verify operation may not only prevent the threshold voltages of the cells that have been close to the target level from rapidly increasing and thus prevent the threshold voltage distribution thereof from widening, but may also gently increase the threshold voltages so as to further narrow the threshold voltage distribution width. For this operation, the verify operation may be performed using both a main verify voltage corresponding to a target program state, and an auxiliary verify voltage corresponding to the main verify voltage. A process of performing a double verify operation for the first program state using the first auxiliary verify voltage Vr1* and the first main verify voltage Vr1 will be described.

Figure 10:
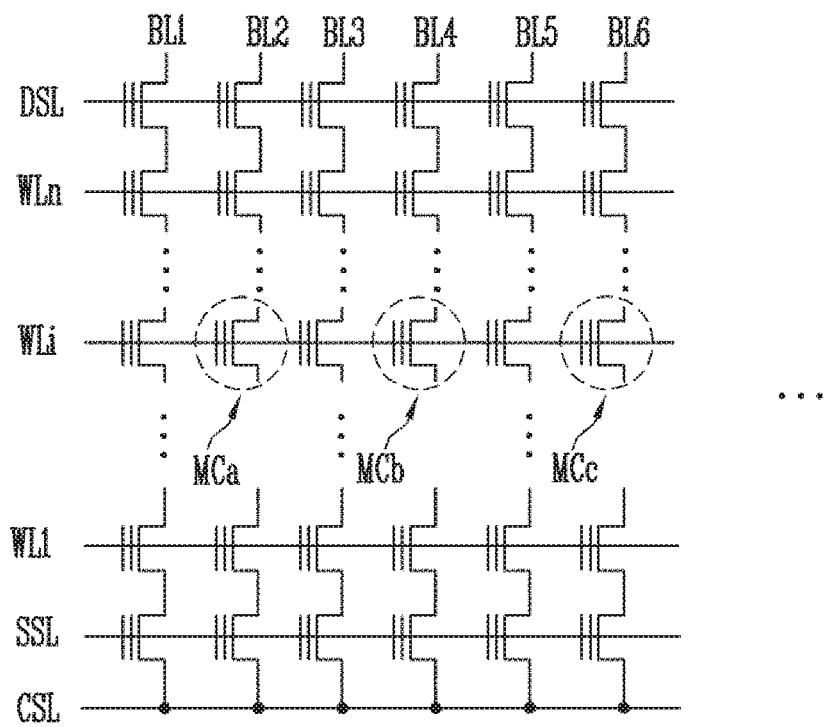
FIG. 10 is a circuit diagram illustrating exemplary memory cells to describe the double verify operation shown in FIG. 9.
Figure 11:
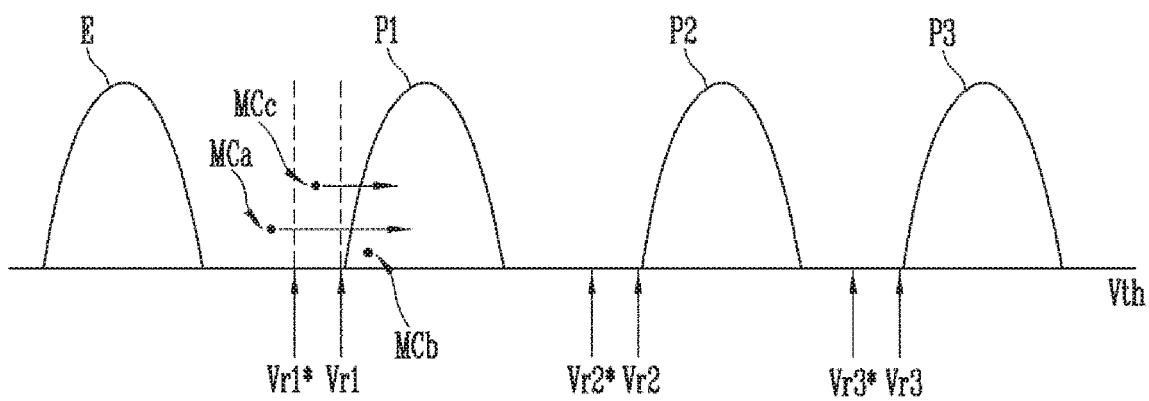
FIG. 11 is a diagram illustrating the double verify operation for the memory cells shown in FIG. 10 and an example of an operation of adjusting bit line voltages according to the double verify operation.

FIG. 10 is a circuit diagram illustrating memory cells MCa, MCb, and MCc to describe the double verify operation shown in FIG. 9. FIG. 11 is a diagram illustrating the double verify operation for the memory cells MCa, MCb, and MCc shown in FIG. 10 and an operation of adjusting bit line voltages according to the double verify operation. Referring to FIG. 10, there is illustrated a portion of the memory block BLK1 or BLK1' shown in FIG. 3 or 4. These operations are described below with reference to FIGS. 10 and 11.

Referring to FIG. 10, an i-th physical page is to be programmed. Thus, during a program operation, a program voltage is applied to an i-th word line WLi, and a pass voltage is applied to the other word lines WL1 to WL(i−1) and WL(i+1) to WLn.

In FIG. 11, threshold voltages of the memory cells MCa, MCb, and MCc during the program operation are illustrated. In FIG. 11, the horizontal axis indicates the threshold voltage Vth of the memory cell. Furthermore, an erase state E, a first program state P1, a second program state P2, and a third program state P3 are illustrated. Auxiliary verify voltages Vr1*, Vr2*, and Vr3* and main verify voltages Vr1, Vr2, and Vr3, which correspond to the respective program states, are also illustrated in FIG. 11.

For ease of explanation, it is assumed that a target program state of each of the memory cells MCa, MCb, and MCc is the first program state P1. The double verify operation is to be performed to the memory cells MCa, MCb, and MCc having the threshold voltages shown in FIG. 11 while program loops are repeated.

The threshold voltages of the memory cells MCa, MCb, and MCc are determined by applying the first auxiliary verify voltage Vr1*. Also, the threshold voltages of the memory cells MCa, MCb, and MCc are determined by applying the first main verify voltage Vr1. By the two above-described verify operations, it may be determined whether the threshold voltage of each of the memory cells MCa, MCb, and MCc is less than the first auxiliary verify voltage Vr1*, is between the first auxiliary verify voltage Vr1* and the main verify voltage Vr1, or is greater than the first main verify voltage Vr1.

The threshold voltage of the memory cell MCa is less than the first auxiliary verify voltage Vr1*. Therefore, during a subsequent program loop, the amount of shift of the threshold voltage of the memory cell MCa may be relatively large, so that the number of program loops may be reduced. The threshold voltage of the memory cell MCc is greater than the first auxiliary verify voltage Vr1* and less than the first main verify voltage Vr1. In other words, the threshold voltage of the memory cell MCc has almost reached the target program state P1. Therefore, to prevent the distribution width from widening due to an excessive increase in shift amount of the threshold voltage, the shift amount of the threshold voltage of the memory cell MCc may be relatively reduced during the subsequent program loop. In order to make the increase rates of the threshold voltages of the two memory cells MCa and MCc different from each other, the bit line voltages to be applied to the corresponding bit lines BL2 and BL6 may be adjusted. In other words, a program allowable voltage having a relatively low voltage level is applied to the bit line BL2 coupled to the memory cell MCa, which should shift its threshold voltage by a relatively large amount during the subsequent program loop. Furthermore, a program allowable voltage having a relatively high voltage level is applied to the bit line BL6 coupled to the memory cell MCc, which should shift its threshold voltage by a relatively small amount during the subsequent program loop.

On the other hand, the threshold voltage of the memory cell MCb is greater than the first main verify voltage Vr1. In other words, because the threshold voltage of the memory cell MCb has reached to the target program state P1, the threshold voltage of the memory cell MCb is controlled not to be shifted during the subsequent program loop. Therefore, during the subsequent program loop, a program inhibit voltage may be applied to the bit line BL4 coupled to the memory cell MCb.

Although, in FIG. 11, only the verify operation for the first program state P1 has been illustrated, a verify operation for the second program state P2 or the third program state P3 may also be performed in a manner similar to that of the first program state P1.

FIGS. 8 to 11 illustrate a method of performing the double verify operation by applying two kinds of verify voltages, i.e., the auxiliary verify voltage and the main verify voltage, to the word line. However, in methods of operating the semiconductor memory device in accordance with embodiments of the present disclosure, the double verify operation may be performed in various ways different from that illustrated in FIGS. 8 to 11. Another method of performing the double verify operation will be described with reference to FIGS. 12, 13, 14A, and 14B.

Figure 12:
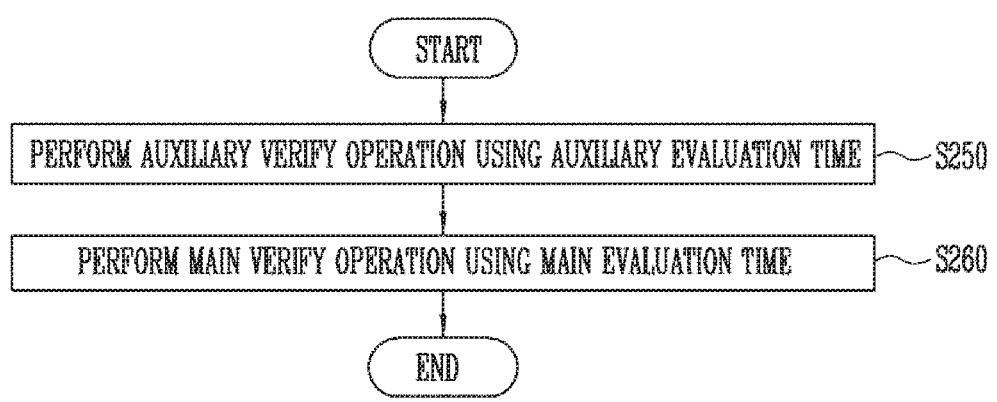
FIG. 12 is a flowchart describing in detail an example of the program verify step of FIG. 5.

FIG. 12 is a flowchart describing in detail an example of the program verify step S150 of FIG. 5.

Referring to FIG. 12, the step S150 of performing, as shown in FIG. 5, the program verify operation on the selected physical page by the double verify scheme includes the step S250 of performing an auxiliary verify operation using an auxiliary evaluation time tEV*, and the step S260 of performing a main verify operation using a main evaluation time tEV. Although, in FIG. 12, the step S250 of performing the auxiliary verify operation has been illustrated as preceding the step S260 of performing the main verify operation, aspects of the present invention are not limited to this sequence. For instance, the main verify operation may be performed before the auxiliary verify operation is performed. The auxiliary verify operation and the main verify operation will be described with reference also to FIG. 13.

Figures 13, 14A, 14B:
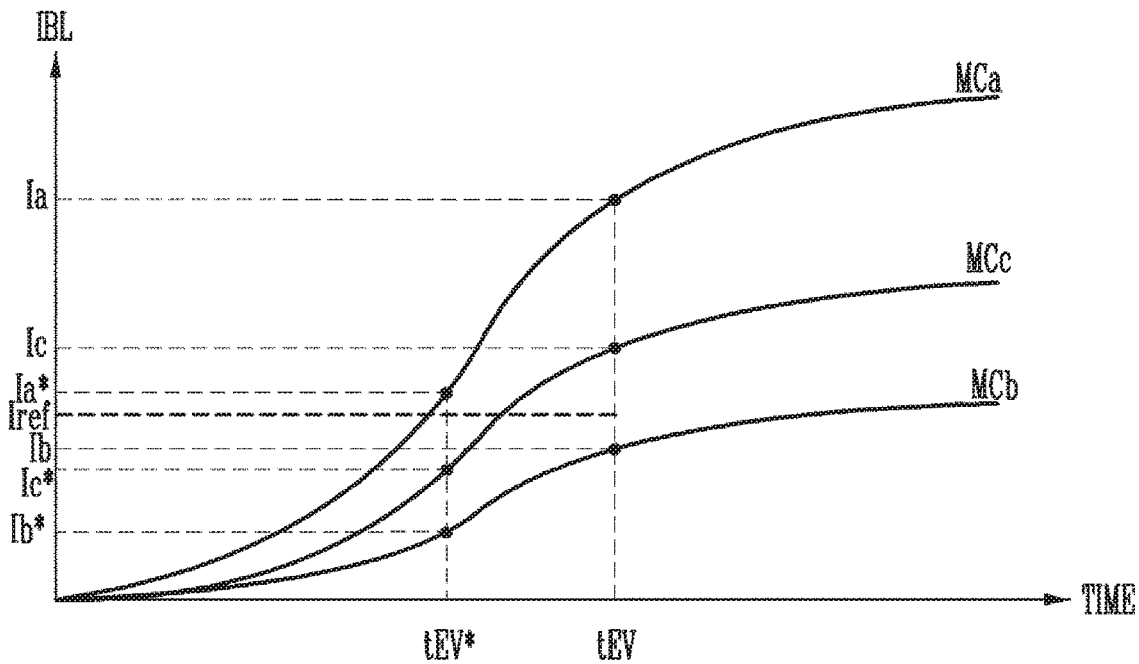
FIG. 13 is a diagram illustrating examples of the auxiliary verify operation and the main verify operation of FIG. 12.
FIG. 14A is a diagram illustrating exemplary steps of the double verify operation shown in FIGS. 8 to 11.
FIG. 14B is a diagram illustrating the effect of the exemplary double verify operation shown in FIGS. 12 and 13.

FIG. 13 is a diagram illustrating the auxiliary verify operation and the main verify operation of FIG. 12. In detail, FIG. 13 illustrates a graph showing a bit line current IBL as a function of time TIME during a sensing operation on the memory cells MCa, MCb, and MCc. Referring to FIG. 13, there is illustrated an effect of the use of a plurality of evaluation times tEV* and tEV to sense the threshold voltages of the memory cells MCa, MCb, and MCc.

Referring to FIG. 13, bit line currents IBL at the auxiliary evaluation time tEV* and the main evaluation time tEV are determined on a curve corresponding to the threshold voltage state of each of the memory cells MCa, MCb, and MCc. In FIG. 13, a combination of the auxiliary evaluation time tEV* and a reference current Iref may correspond to the first auxiliary verify voltage Vr1* shown in FIG. 11. In FIG. 13, a combination of the main evaluation time tEV and the reference current Iref may correspond to the first main verify voltage Vr1 shown in FIG. 11. In an embodiment, while a verify voltage is applied to the i-th word line WLi as shown in FIG. 10, the measure bit line current IBL is compared with the reference current Iref. In this way, it is determined whether the target memory cell is an on-cell or an off-cell. In this embodiment, the verify voltage to be applied to the i-th word line WLi may be a single verify voltage. For example, the verify voltage to be applied to the i-th word line WLi may have the same level as that of the main verify voltage Vr1 shown in FIG. 11.

The threshold voltage of the memory cell MCa is less than the threshold voltage of the memory cell MCb or MCc, as shown in FIG. 11. Therefore, the current flowing through the bit line coupled to the memory cell MCa during a sensing period is most steeply increased. The bit line current IBL measured on the memory cell MCa at the auxiliary evaluation time tEV* has an auxiliary current value Ia*. The bit line current IBL measured on the memory cell MCa at the main evaluation time tEV has a main current value Ia.

In the case of sensing the memory cell MCa using the reference current Iref, the memory cell MCa may be determined to be an on-cell because the auxiliary current Ia*, which is the bit line current IBL measured at the auxiliary evaluation time tEV*, is greater than the reference current Iref. Furthermore, the memory cell MCa may be determined to be an on-cell because the main current value Ia, which is the bit line current IBL measured at the main evaluation time tEV, is greater than the reference current Iref. As described above, in FIG. 13, the combination of the auxiliary evaluation time tEV* and the reference current Iref may correspond to the first auxiliary verify voltage Vr1* shown in FIG. 11, and the combination of the main evaluation time tEV and the reference current Iref may correspond to the first main verify voltage Vr1 shown in FIG. 11. Because the memory cell MCa is determined to be an on-cell as a result of the measurement using the auxiliary evaluation time tEV* and, also, the memory cell MCa is determined to be an on-cell as a result of the measurement using the main evaluation time tEV, the threshold voltage of the memory cell MCa may be determined to be less than the first auxiliary verify voltage Vr1* and the first main verify voltage Vr1.

On the other hand, the threshold voltage of the memory cell MCb is greater than the threshold voltage of the memory cell MCa or MCc, as shown in FIG. 11. Therefore, the current flowing through the bit line coupled to the memory cell MCb during the sensing period is most gradually increased. The bit line current IBL measured on the memory cell MCb at the auxiliary evaluation time tEV* has an auxiliary current value Ib*. The bit line current IBL measured on the memory cell MCb at the main evaluation time tEV has a main current value Ib.

In the case of sensing the memory cell MCb using the reference current Iref, the memory cell MCb may be determined to be an off-cell because the auxiliary current Ib*, which is the bit line current IBL measured at the auxiliary evaluation time tEV*, is less than the reference current Iref. Furthermore, the memory cell MCb may be determined to be an off-cell because the main current value Ib, which is the bit line current IBL measured at the main evaluation time tEV, is less than the reference current Iref. As described above, in FIG. 13, the combination of the auxiliary evaluation time tEV* and the reference current Iref may correspond to the first auxiliary verify voltage Vr1* shown in FIG. 11, and the combination of the main evaluation time tEV and the reference current Iref may correspond to the first main verify voltage Vr1 shown in FIG. 11. Because the memory cell MCb is determined to be an off-cell as a result of the measurement using the auxiliary evaluation time tEV* and, also, the memory cell MCb is determined to be an off-cell as a result of the measurement using the main evaluation time tEV, the threshold voltage of the memory cell MCb may be determined to be greater than the first auxiliary verify voltage Vr1* and the first main verify voltage Vr1.

On the other hand, the threshold voltage of the memory cell MCc is greater than the threshold voltage of the memory cell MCa and less than the threshold voltage of the memory cell MCb, as shown in FIG. 11. Therefore, the current flowing through the bit line coupled to the memory cell MCc during the sensing period is increased more gradually than that of the memory cell MCa and increased more steeply than that of the memory cell MCb. The bit line current IBL measured on the memory cell MCc at the auxiliary evaluation time tEV* has an auxiliary current value Ic*. The bit line current IBL measured on the memory cell MCc at the main evaluation time tEV has a main current value Ic.

In the case of sensing the memory cell MCc using the reference current Iref, the memory cell MCc may be determined to be an off-cell because the auxiliary current Ic*, which is the bit line current IBL measured at the auxiliary evaluation time tEV*, is less than the reference current Iref. Furthermore, the memory cell MCc may be determined to be an on-cell because the main current value Ic, which is the bit line current IBL measured at the main evaluation time tEV, is greater than the reference current Iref. As described above, in FIG. 13, the combination of the auxiliary evaluation time tEV* and the reference current Iref may correspond to the first auxiliary verify voltage Vr1* shown in FIG. 11, and the combination of the main evaluation time tEV and the reference current Iref may correspond to the first main verify voltage Vr1 shown in FIG. 11. Because the memory cell MCc is determined to be an off-cell as a result of the measurement using the auxiliary evaluation time tEV* and, also, the memory cell MCc is determined to be an on-cell as a result of the measurement using the main evaluation time tEV, the threshold voltage of the memory cell MCc may be determined to be greater than the first auxiliary verify voltage Vr1* and less than the first main verify voltage Vr1.

As described above, the double verify operation may be performed in such a way that, while the single verify voltage is applied to the word line, different evaluation times are used during the sensing operation.

FIG. 14A is a diagram illustrating the steps of the double verify operation shown in FIGS. 8 to 11, and FIG. 14B is a diagram illustrating the effect of the double verify operation shown in FIGS. 12 and 13.

Referring to FIG. 14A, to perform the double verify operation shown in FIGS. 8 to 11, the bit lines are precharged, the sensing operation using the first auxiliary verify voltage Vr1 is performed, the bit lines are precharged again, and the sensing operation using the first main verify voltage Vr1 is performed. As shown in FIG. 14A, to perform the double verify operation in such a way that the auxiliary verify voltage and the main verify voltage are applied to the word line, the bit lines must be precharged two times. Thus, due to the repeated bit line precharge operations, the time it takes to perform the overall verify operation is increased.

Referring to FIG. 14B, to perform the double verify operation shown in FIGS. 12 and 13, the bit lines are precharged, the sensing operation using the auxiliary evaluation time tEV* is performed, and then the sensing operation using the main evaluation time tEV is performed. Unlike shown in FIG. 14A, the operation of precharging the bit lines in FIG. 14B is performed once. Therefore, compared to the double verify operation shown in FIG. 14A, the time it takes to perform the operation of precharging the bit line is reduced; thus, the time it takes to perform the overall verify operation is reduced.

In other words, in the case where the double verify operation is performed using the two evaluation times tEV* and tEV in the manner shown in FIGS. 12 and 13, the time it takes to perform the overall verify operation is reduced. As a result, the operating speed of the semiconductor memory device may be enhanced.

Figure 15:
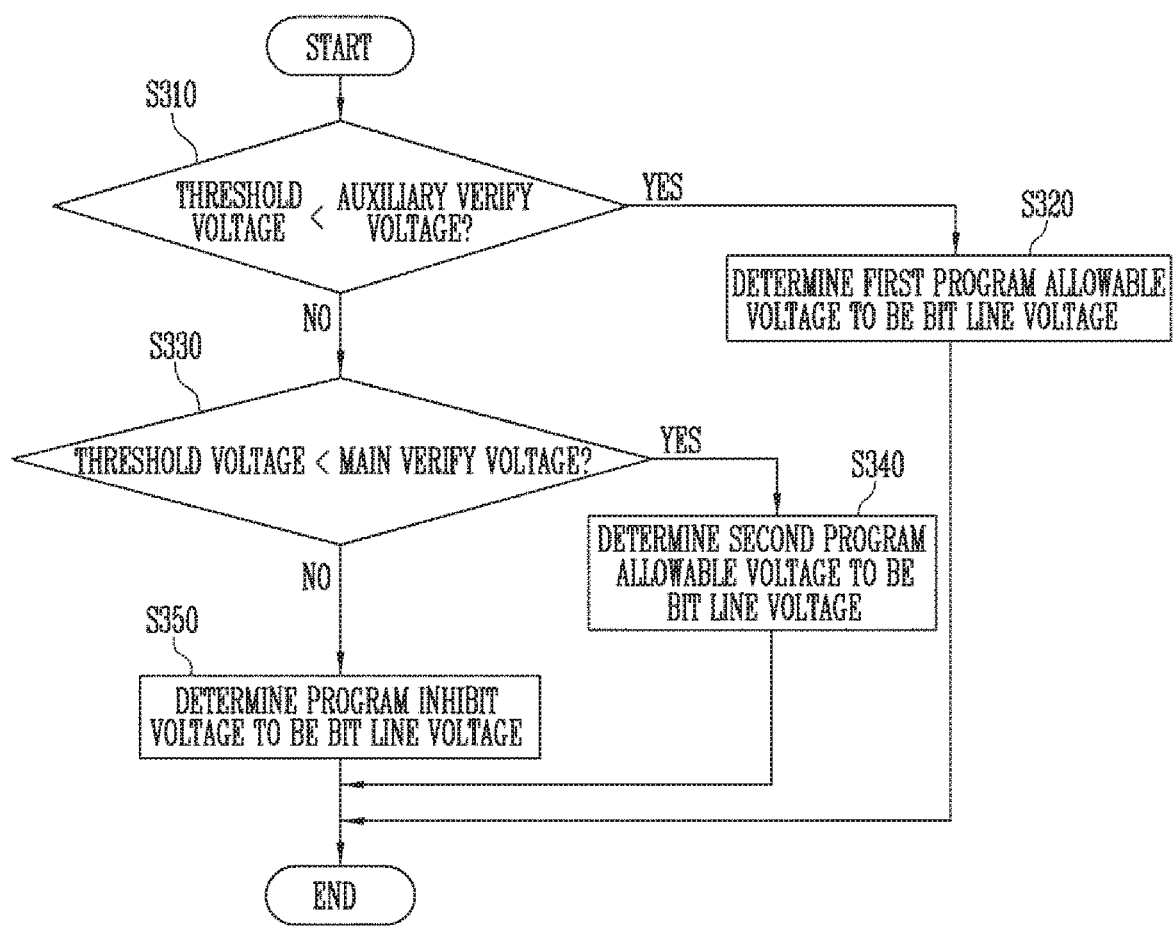
FIG. 15 is a flowchart describing in detail an example of a bit line voltage determination step shown in FIG. 5.

FIG. 15 is a flowchart describing in detail the bit line voltage determination step S170 shown in FIG. 5. Referring to FIG. 15, a bit line voltage to be applied to a subsequent program loop is determined based on a result of the verify operation performed in step S150 of FIG. 5. FIG. 15 illustrates the step of determining, based on the threshold voltage of each memory cell in the selected physical page, a bit line voltage to be applied to a bit line coupled to the corresponding memory cell during the subsequent program loop. In other words, it is to be noted that the steps shown in FIG. 15 are individually performed on each of the memory cells in the selected physical page.

At step S310, it is determined whether the threshold voltage of the corresponding memory cell is less than an auxiliary verify voltage of a target program state. At step S310, the auxiliary verify voltage that is a comparison target is determined depending on what the target program state of the corresponding memory cell is. For example, if the target program state of the corresponding memory cell is the first program state P1, the threshold voltage of the memory cell is compared with the first auxiliary verify voltage Vr1* at step S310. If the target program state of the corresponding memory cell is the second program state P2, the threshold voltage of the memory cell is compared with the second auxiliary verify voltage Vr2* at step S310. If the target program state of the corresponding memory cell is the third program state P3, the threshold voltage of the memory cell is compared with the third auxiliary verify voltage Vr3* at step S310. On the other hand, as described with reference to FIGS. 12 to 14A and 14B, the auxiliary evaluation time tEV* may be used to determine whether the threshold voltage of the corresponding memory cell is less than the auxiliary verify voltage.

If the threshold voltage of the memory cell is less than the auxiliary verify voltage (that is, "YES" at step S310), the bit line voltage determination operation proceeds step S320, at which a first program allowable voltage is determined to be a voltage to be applied to the bit is line coupled to the corresponding memory cell. In this case, a voltage capable of increasing the threshold voltage by a relatively large amount in the same manner as that of the memory cell MCa shown in FIGS. 10 and 11 may be determined to be the first program allowable voltage. For example, the first program allowable voltage may be the ground voltage.

If the threshold voltage of the memory cell is not less than the auxiliary verify voltage (that is, "NO" at step S310), it is determined whether the threshold voltage of the corresponding memory cell is less than the main verify voltage at step S330. At step S330, the main verify voltage that is a comparison target is determined depending on what the target program state of the corresponding memory cell is. For example, if the target program state of the corresponding memory cell is the first program state P1, the threshold voltage of the memory cell is compared with the first main verify voltage Vr1 at step S330. If the target program state of the corresponding memory cell is the second program state P2, the threshold voltage of the memory cell is compared with the second main verify voltage Vr2 at step S330. If the target program state of the corresponding memory cell is the third program state P3, the threshold voltage of the memory cell is compared with the third main verify voltage Vr3 at step S330. On the other hand, as described with reference to FIGS. 12 to 14A and 14B, the main evaluation time tEV may be used to determine whether the threshold voltage of the corresponding memory cell is less than the main verify voltage.

If the threshold voltage of the memory cell is less than the main verify voltage, the process enters step S340, at which a second program allowable voltage is determined to be a voltage to be applied to the bit line coupled to the corresponding memory cell. In this case, a voltage capable of increasing the threshold voltage by a relatively small amount in the same manner as that of the memory cell MCc shown in FIGS. 10 and 11 may be determined to be the second program allowable voltage. For instance, the second program allowable voltage may be a voltage greater than the first program allowable voltage and less than the program inhibit voltage.

If the threshold voltage of the memory cell is not less than the main verify voltage, this means that the threshold voltage of the corresponding memory cell has reached the target program state. Therefore, in this case, the bit line voltage determination operation proceeds to step S350, at which the program inhibit voltage is determined to be a bit line voltage to be applied to the bit line coupled to the corresponding memory cell.

In this way, the voltages of the bit lines coupled to the selected physical page are re-determined through the steps shown in FIG. 15. Based on the re-determined voltages of the bit lines, the subsequent program loop may be performed.

Figure 16:
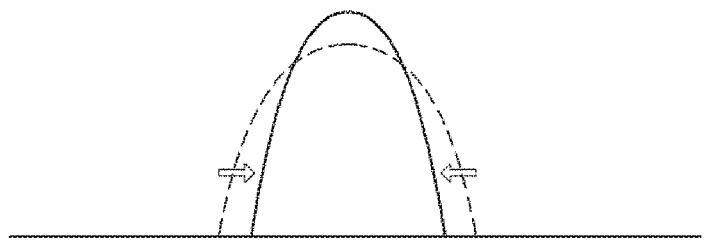
FIG. 16 is a diagram illustrating the effect of a method of operating the semiconductor memory device in accordance with an embodiment of the present disclosure.

FIG. 16 is a diagram illustrating the effect of the method of operating the semiconductor memory device in accordance with an embodiment of the present disclosure.

Referring to FIG. 16, the threshold voltage distribution width of each program state may be narrowed by the method of programming the semiconductor memory device in accordance with embodiments of the present disclosure. As described above, because the scheme of applying a two-step program pulse to a selected word line is used at step S130, a left tail of the threshold voltage distribution may be reduced. Furthermore, since the program allowable voltage to be applied to the bit line is adjusted by the double verify scheme at steps S150 and S170, a right tail of the threshold voltage distribution may be reduced. Consequently, the threshold voltage distribution width is narrowed, so that the read margin is increased, whereby the operation reliability of the semiconductor memory device may be enhanced.

In the semiconductor memory device and the operating method thereof in accordance with an embodiment of the present disclosure, because a two-step program pulse is applied during the program operation, an amount of shift of the threshold voltage of a memory cell, the threshold voltage of which is very far from that of a target program state, is comparatively increased. Hence, the total number of times the program loops are performed may be reduced. Consequently, the program speed of the semiconductor memory device may be improved.

Figure 17:
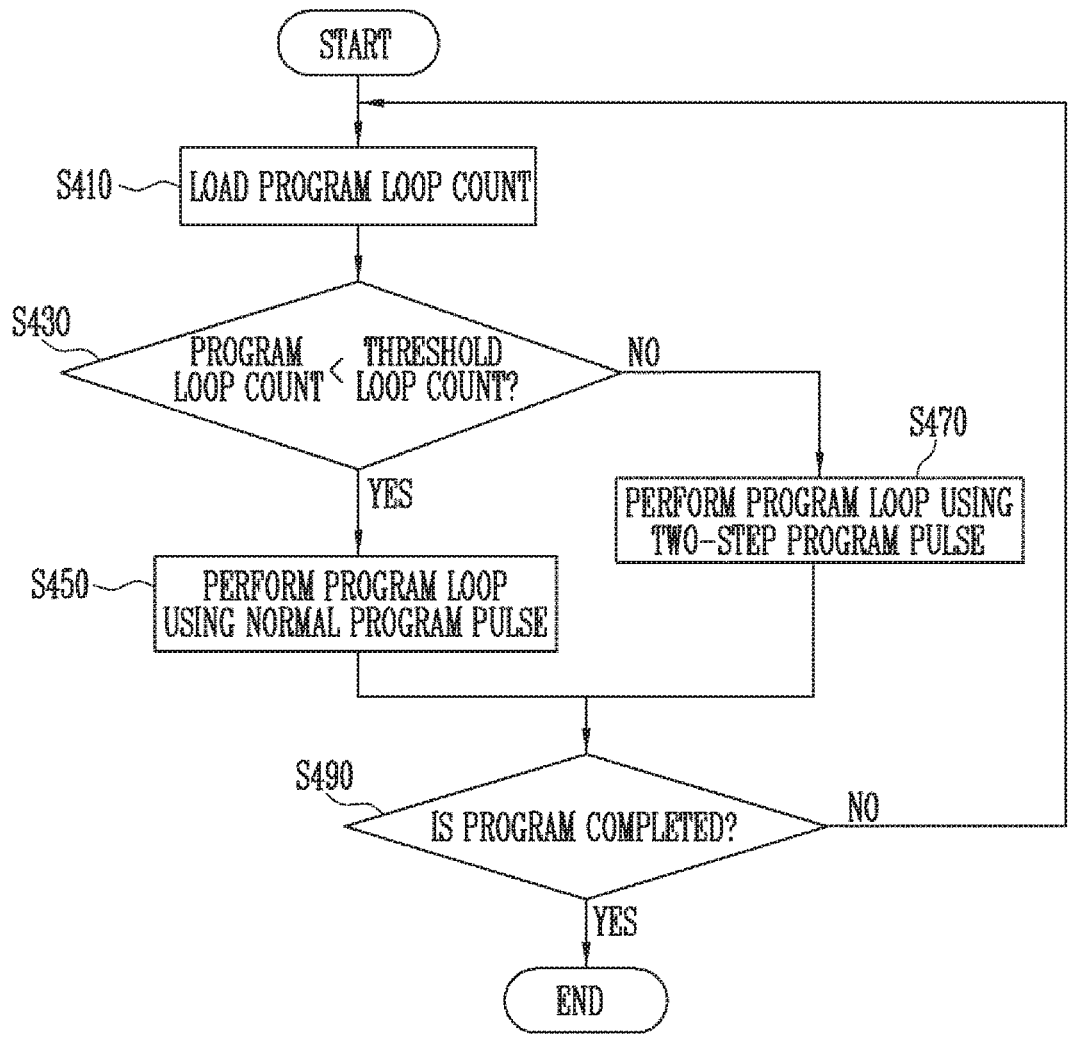
FIG. 17 is a flowchart describing a program method in accordance with an embodiment of the present disclosure.

FIG. 17 is a flowchart describing the program method in accordance with an embodiment of the present disclosure.

Referring to FIG. 17, each time a program loop is performed, the number of program loops performed is loaded at step S410. The number of program loops corresponds to the total number of times the program loops are performed since the program operation has started. For example, FIG. 7 illustrates four program loops of a plurality of program loops. The control logic 140 of the semiconductor memory device 100 may count and store the number of times of program loops each time a program loop is performed.

At step S430, it is determined whether the loaded number of program loops is less than a threshold value. If the loaded number of program loops is less than the threshold value (that is, "YES" at step S430), the program operation proceeds to step S450, at which a program loop using a normal program pulse is performed. The normal program pulse may be a program pulse having a single voltage level, unlike the two-step program pulse shown in FIG. 7.

If the loaded number of program loops is equal to or greater than the threshold value (that is, "NO" at step S430), the program operation proceeds to step S470, at which a program loop using a two-step program pulse is performed.

After the program loop using the normal program pulse has been performed at step S450, or after the program loop using the two-step program pulse has been performed at step S470, it is determined whether the program has been completed at step S490. If the program has been completed (that is, "YES" at step S490), the program operation for the selected physical page is terminated. If the program has not been completed (that is, "NO" at step S490), steps S410, S430, S450, S470, and S490 may be repeated.

As shown in the method of FIG. 17, a program loop using a normal program pulse is performed at step S450 during some period of the program operation, and a program loop using a two-step program pulse is performed at step S470 during some other period of the program operation, depending on the determination at step S430. The program method of the semiconductor memory device shown in FIG. 17 will be described in more detail below with reference to FIG. 18.

Figure 18:
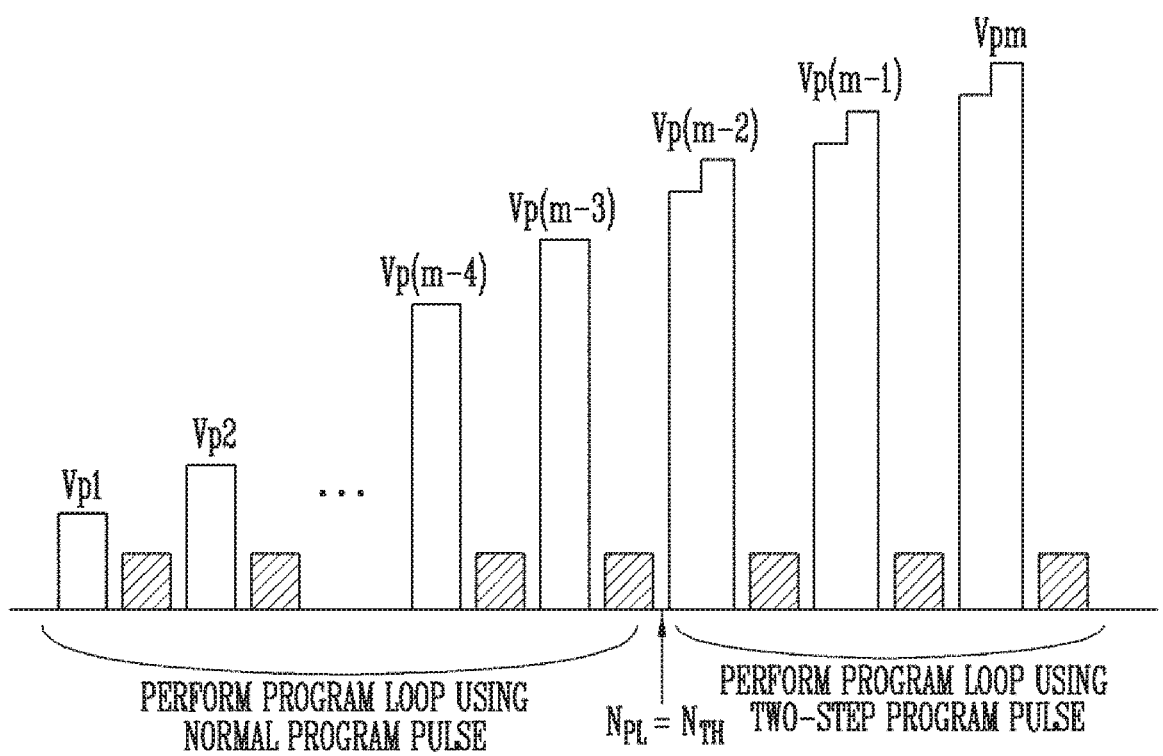
FIG. 18 is a diagram illustrating an exemplary program method shown in FIG. 17.

FIG. 18 is a diagram illustrating the program method shown in FIG. 17.

Referring to FIG. 18, if the program operation for the selected physical page starts, a program loop using a first program pulse Vp1 is performed. As shown in FIG. 18, the first program pulse Vp1 is a normal program pulse. When each program loop is performed, a current program loop count $N_{PL}$ is compared with a threshold loop count $N_{TH}$. When each program loop is completed, the current program loop count $N_{PL}$ may be updated. Under a condition in which the current program loop count $N_{PL}$ is less than the threshold loop count $N_{TH}$, a program loop using a normal program pulse Vp1, Vp2, ..., Vp(m−4), or Vp(m−3) is performed.

As the program loop count increases, the current program loop count $N_{PL}$ approaches the threshold loop count $N_{TH}$, and at some point they become equal. In FIG. 18, there is illustrated an example where, after an m−3-th program loop is performed, the current program loop count NFL equals the threshold loop count $N_{TH}$. Therefore, in the example of FIG. 18, the threshold loop count $N_{TH}$ has a value of "m−3". In other words, from an m−2 program loop, a program loop using a two-step program pulse Vp(m−2), Vp(m−1), or Vpm is performed.

In the example of FIG. 18, the maximum program loop count for the program operation has a value of "m". If the program has not been completed even when the number of times the program loops have been performed corresponds to the maximum program loop count, the semiconductor memory device 100 determines that the corresponding program operation has failed. In the program method in accordance with an embodiment of the present disclosure, generally, a program loop using a normal program pulse is repeatedly performed, and, if the program has not been completed despite that the current program loop count has been close to the maximum program loop count (m), a program loop using a two-step program pulse is performed. As described above, if the program loop using the two-step program pulse is performed, the amount of shift of threshold voltages of slow cells which have still not been completely programmed may be further increased. Consequently, the probability of program failure may be reduced. As a result, the operation reliability of the semiconductor memory device may be enhanced.

A program verify operation to be performed in each program loop may be performed by the double verify scheme described with reference to FIGS. 8 to 15.

Figure 19:
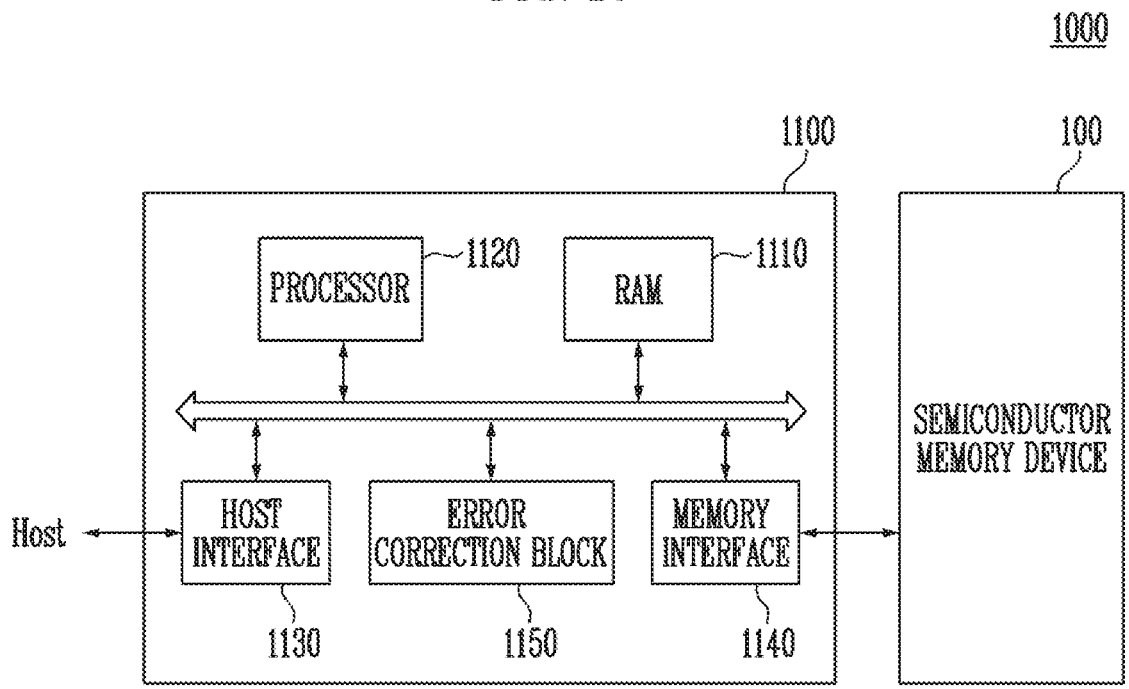
FIG. 19 is a block diagram illustrating a memory system including the semiconductor memory device of FIG. 1 in accordance with an embodiment of the present disclosure.

FIG. 19 is a block diagram illustrating a memory system 1000 including the semiconductor memory device of FIG. 1 in accordance with an embodiment of the present disclosure.

Referring to FIG. 19, the memory system 1000 includes a semiconductor memory device 100 and a controller 1100. The semiconductor memory device 100 may have the same configuration and operation as the semiconductor memory device described with reference to FIG. 1. Thus, common description is omitted below.

The controller 1100 is coupled to a host (Host) and the semiconductor memory device 100. The controller 1100 may access the semiconductor memory device 100 in response to a request from the host. For example, the controller 1100 may control a read operation, a write operation, an erase operation, and a background operation of the semiconductor memory device 100. The controller 1100 may provide an interface between the host and the semiconductor memory device 100. The controller 1100 may drive firmware for controlling the semiconductor memory device 100.

The controller 1100 may include a random access memory (RAM) 1110, a processor 1120, a host interface 1130, a memory interface 1140, and an error correction block 1150. The RAM 1110 may be used as at least one of an operating memory for the processor 1120, a cache memory between the semiconductor memory device 100 and the host, and a buffer memory between the semiconductor memory device 100 and the host. The processor 1120 may control the overall operation of the controller 1100. In addition, the controller 1100 may temporarily store program data provided from the host during the write operation.

The host interface 1130 may include a protocol for performing data exchange between the host and the controller 1100. In an embodiment, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 may interface with the semiconductor memory device 100. For example, the memory interface may include a NAND interface or a NOR interface.

The error correction block 1150 may use an error correcting code (ECC) to detect and correct an error in data received from the semiconductor memory device 100. The processor 1120 may adjust the read voltage according to an error detection result from the error correction block 1150, and control the semiconductor memory device 100 to perform re-reading. In an embodiment, the error correction block may be provided as a component of the controller 1100.

The controller 1100 and the semiconductor memory device 100 may be integrated into a single semiconductor device. In an embodiment, the controller 1100 and the semiconductor memory device 100 may be so integrated to form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), and a universal flash storage (UFS).

The controller 1100 and the semiconductor memory device 100 may be integrated into a single semiconductor device to form a solid state drive (SSD). The SSD may include a storage device configured to store data to a semiconductor memory. When the memory system 1000 is used as the SSD, the operating speed of the host coupled to the memory system 2000 may be phenomenally improved.

In an embodiment, the memory system 1000 may be provided as one of various elements of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 20:
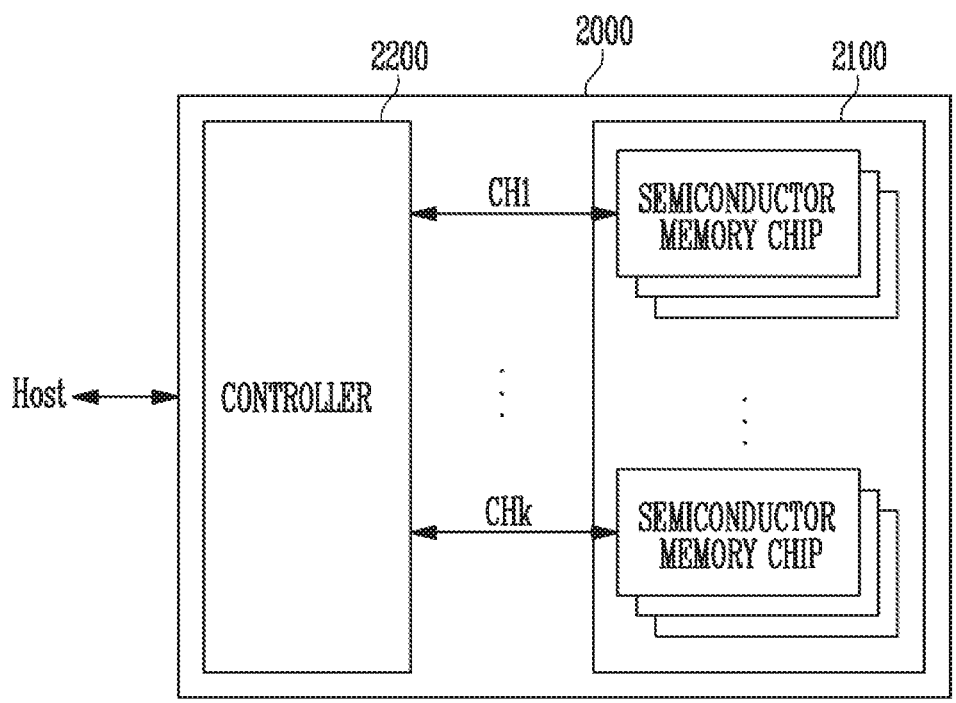
FIG. 20 is a block diagram illustrating an exemplary application of the memory system of FIG. 19.

FIG. 20 is a block diagram illustrating an exemplary application of the memory system of FIG. 19.

Referring FIG. 20, a memory system 2000 may include a semiconductor memory device 2100 and a controller 2200. The semiconductor memory device 2100 may include a plurality of semiconductor memory chips. The semiconductor memory chips are divided into a plurality of groups.

In FIG. 20, it is illustrated that the respective groups communicate with the controller 2200 through first to k-th channels CH1 to CHk. Each semiconductor memory chip may have the same configuration and operation as those of a component of the semiconductor memory device 100 described with reference to FIG. 1.

Each group of semiconductor chips may communicate with the controller 2200 through one common channel. The controller 2200 may have the same configuration as that of the controller 1100 described with reference to FIG. 19 and control a plurality of memory chips of the semiconductor memory device 2100 through the plurality of channels CH1 to CHk.

Figure 21:
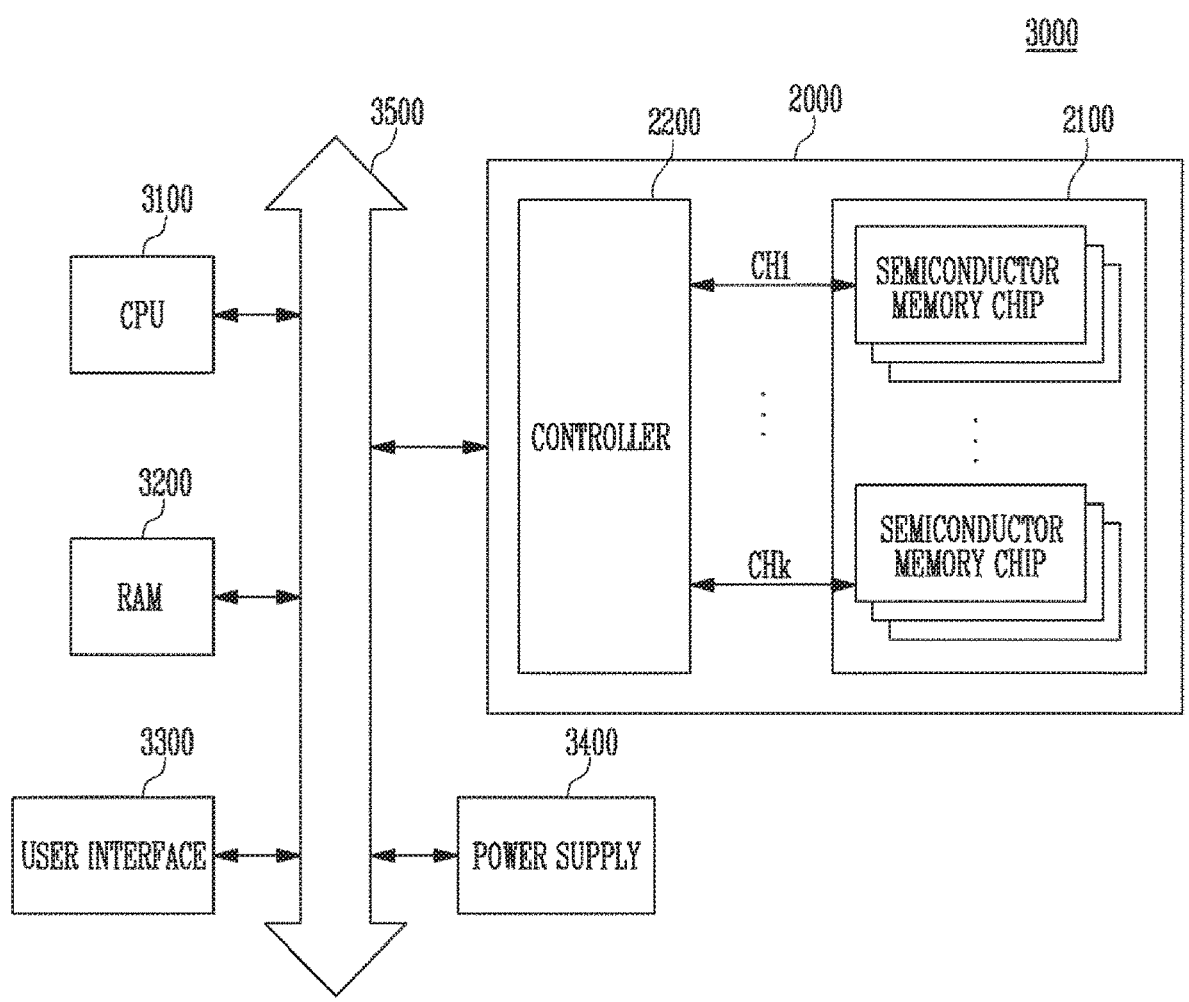
FIG. 21 is a block diagram illustrating a computing system including the memory system illustrated with reference to FIG. 20 in accordance with an embodiment of the present disclosure.

FIG. 21 is a block diagram illustrating a computing system 3000 including the memory system 2000 illustrated with reference to FIG. 20 in accordance with an embodiment of the present disclosure.

The computing system 3000 may include a central processing unit (CPU) 3100, a RAM 3200, a user interface 3300, a power supply 3400, a system bus 3500, and the memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 21, the semiconductor memory device 2100 is illustrated as being coupled to the system bus 3500 through the controller 2200. Alternatively, the semiconductor memory device 2100 may be directly coupled to the system bus 3500. The function of the controller 2200 may be performed by the CPU 3100 and the RAM 3200.

In FIG. 21, the memory system 2000 described with reference to FIG. 20 may be replaced with the memory system 1000 described with reference to FIG. 19. In an embodiment, the computing system 3000 may be formed of both the memory systems 1000 and 2000 described with reference to FIGS. 19 and 20.

Various embodiments of the present disclosure may provide a semiconductor memory device having improved operating speed and reliability.

Various embodiments of the present disclosure may provide a method of operating a semiconductor memory device having improved speed and reliability.

Various embodiments have been disclosed, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a semiconductor memory device to program a selected physical page of the semiconductor memory device, the method comprising performing a plurality of program loops,
wherein each of the program loops comprises:
applying a bit line voltage based on data input to a page buffer of the semiconductor memory device;
applying a two-step program pulse to a word line coupled to the selected physical page;
performing a program verify operation on the selected physical page using a double verify scheme; and determining a bit line voltage to be applied in a subsequent program loop based on a result of the program verify operation,
wherein the performing of the program verify operation on the selected physical page using the double verify scheme comprises:
applying a verify voltage to the word line, the verify voltage corresponding to at least one program state, and performing an auxiliary verify operation using an auxiliary evaluation time; and
applying the verify voltage to the word line, and performing a main verify operation using a main evaluation time, and
wherein the auxiliary evaluation time is shorter than the main evaluation time.

2. The method of claim 1, wherein the applying of the bit line voltage based on the data input to the page buffer comprises:
applying a program allowable voltage to a bit line coupled to a target memory cell to be programmed; and
applying a program inhibit voltage to a bit line coupled to a program inhibit memory cell.

3. The method of claim 1, wherein the determining of the bit line voltage to be applied in the subsequent program loop based on the result of the program verify operation comprises:
determining whether a threshold voltage of a memory cell in the selected physical page is less than an auxiliary verify voltage corresponding to the auxiliary evaluation time; and
determining whether the threshold voltage of the memory cell in the selected physical page is less than a main verify voltage corresponding to the main evaluation time.

4. The method of claim 3, wherein, when the threshold voltage of the memory cell is less than the auxiliary verify voltage, a first program allowable voltage is determined to be a voltage to be applied to a bit line coupled to the memory cell in the subsequent program loop.

5. The method of claim 4, wherein, when the threshold voltage of the memory cell is equal to or greater than the auxiliary verify voltage and less than the main verify voltage, a second program allowable voltage greater than the first program allowable voltage is determined to be the voltage to be applied to the bit line coupled to the memory cell in the subsequent program loop.

6. The method of claim 5, wherein, when the threshold voltage of the memory cell is greater than the main verify voltage, a program inhibit voltage is determined to be the voltage to be applied to the bit line coupled to the memory cell in the subsequent program loop.

7. The method of claim 4, wherein the first program allowable voltage is a ground voltage.

8. A semiconductor memory device comprising:
a memory cell array including a plurality of physical pages;
a peripheral circuit configured to perform a program operation on a selected physical page among the plurality of physical pages, the program operation including a plurality of program loops; and
a control logic configured to control the program operation of the peripheral circuit,
wherein, during a program loop of the program operation of the selected physical page, the control logic controls the peripheral circuit to apply a two-step program pulse to a word line coupled to the selected physical page and perform a program verify operation on the selected physical page using a double verify scheme, and
wherein, to perform the program verify operation on the selected physical page using the double verify scheme, the control logic controls the peripheral circuit to apply a verify voltage corresponding to at least one program state to the word line for an auxiliary evaluation time, and apply the verify voltage to the word line for a main evaluation time longer than the auxiliary evaluation time.

9. The semiconductor memory device of claim 8, wherein, when a threshold voltage of a memory cell in the selected physical page is less than an auxiliary verify voltage corresponding to the auxiliary evaluation time, the control logic determines a first program allowable voltage to be a voltage to be applied to a bit line coupled to the memory cell in a subsequent program loop.

10. The semiconductor memory device of claim 9, wherein, when the threshold voltage of the memory cell is equal to or greater than the auxiliary verify voltage and less than a main verify voltage corresponding to the main evaluation time, the control logic determines a second program allowable voltage to be the voltage to be applied to the bit line coupled to the memory cell in the subsequent program loop, the second program allowable voltage being greater than the first program allowable voltage.

11. The semiconductor memory device of claim 10, wherein, when the threshold voltage of the memory cell is greater than the main verify voltage, the control logic determines a program inhibit voltage to be the voltage to be applied to the bit line coupled to the memory cell in the subsequent program loop.

12. The semiconductor memory device of claim 9, wherein the first program allowable voltage is a ground voltage.

* * * * *